(12) United States Patent
Wang et al.

(10) Patent No.: US 11,205,711 B2
(45) Date of Patent: Dec. 21, 2021

(54) SELECTIVE INNER SPACER IMPLEMENTATIONS

(71) Applicant: Taiwan Semiconductor Manufacturing Co., Ltd., Hsinchu (TW)

(72) Inventors: Pei-Hsun Wang, Hsinchu (TW); Kuo-Cheng Chiang, Hsinchu County (TW); Lo-Heng Chang, Hsinchu (TW); Jung-Hung Chang, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 11 days.

(21) Appl. No.: 16/583,388

(22) Filed: Sep. 26, 2019

(65) Prior Publication Data

US 2021/0098605 A1    Apr. 1, 2021

(51) Int. Cl.
*H01L 29/66* (2006.01)
*H01L 21/306* (2006.01)
*H01L 29/08* (2006.01)
*H01L 21/02* (2006.01)
*H01L 29/06* (2006.01)
*H01L 29/78* (2006.01)
*H01L 29/423* (2006.01)
(Continued)

(52) U.S. Cl.
CPC .. *H01L 29/66553* (2013.01); *H01L 21/02532* (2013.01); *H01L 21/30604* (2013.01); *H01L 27/1104* (2013.01); *H01L 27/1116* (2013.01); *H01L 29/0673* (2013.01); *H01L 29/0847* (2013.01); *H01L 29/1037* (2013.01); *H01L 29/42392* (2013.01); *H01L 29/6653* (2013.01); *H01L 29/6656* (2013.01); *H01L 29/66545* (2013.01); *H01L 29/66636* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 8,963,258 | B2 | 2/2015 | Yu et al. |
| 9,818,872 | B2 | 11/2017 | Ching et al. |
| 9,887,269 | B2 | 2/2018 | Ching et al. |

(Continued)

*Primary Examiner* — Michelle Mandala
(74) *Attorney, Agent, or Firm* — Haynes and Boone, LLP

(57) ABSTRACT

A semiconductor device according to the present disclosure includes first gate-all-around (GAA) devices in a first device area and second GAA devices in a second device area. Each of the first GAA devices includes a first vertical stack of channel members, a first gate structure over and around the first vertical stack of channel members, and a plurality of inner spacer features. Each of the second GAA devices includes a second vertical stack of channel members and a second gate structure over and around the second vertical stack of channel members. Two adjacent channel members of the first vertical stack of channel members are separated by a portion of the first gate structure and at least one of the plurality of inner spacer features. Two adjacent channel members of the second vertical stack of channel members are separated only by a portion of the second gate structure.

20 Claims, 31 Drawing Sheets

(51) Int. Cl.
    *H01L 27/11*      (2006.01)
    *H01L 29/10*      (2006.01)

(56) References Cited

U.S. PATENT DOCUMENTS

| | | |
|---|---|---|
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 2018/0175036 A1 | 6/2018 | Ching et al. |
| 2019/0131431 A1* | 5/2019 | Cheng .................... B82Y 10/00 |
| 2019/0341450 A1* | 11/2019 | Lee ................. H01L 21/823431 |
| 2020/0365703 A1* | 11/2020 | Chung .............. H01L 29/78696 |
| 2020/0381530 A1* | 12/2020 | Chung .............. H01L 29/66439 |

\* cited by examiner

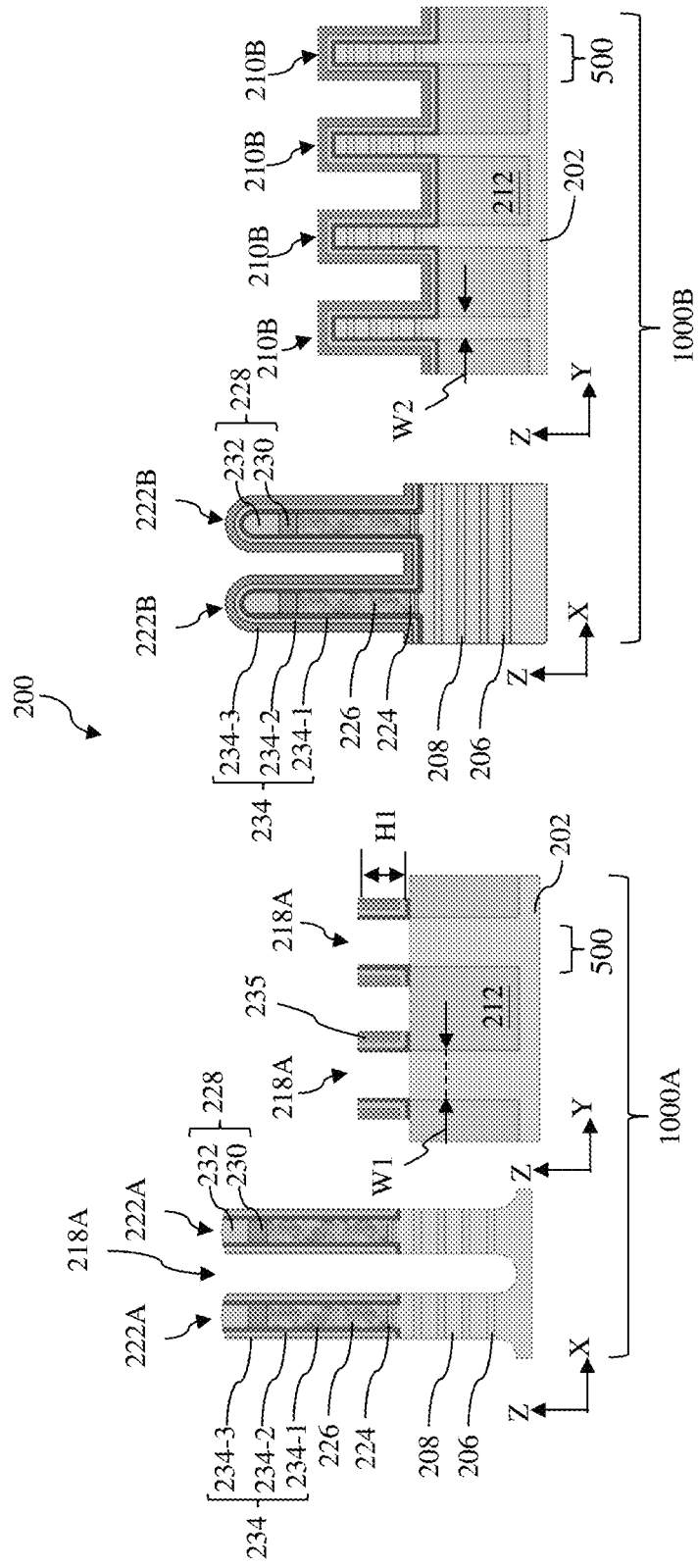

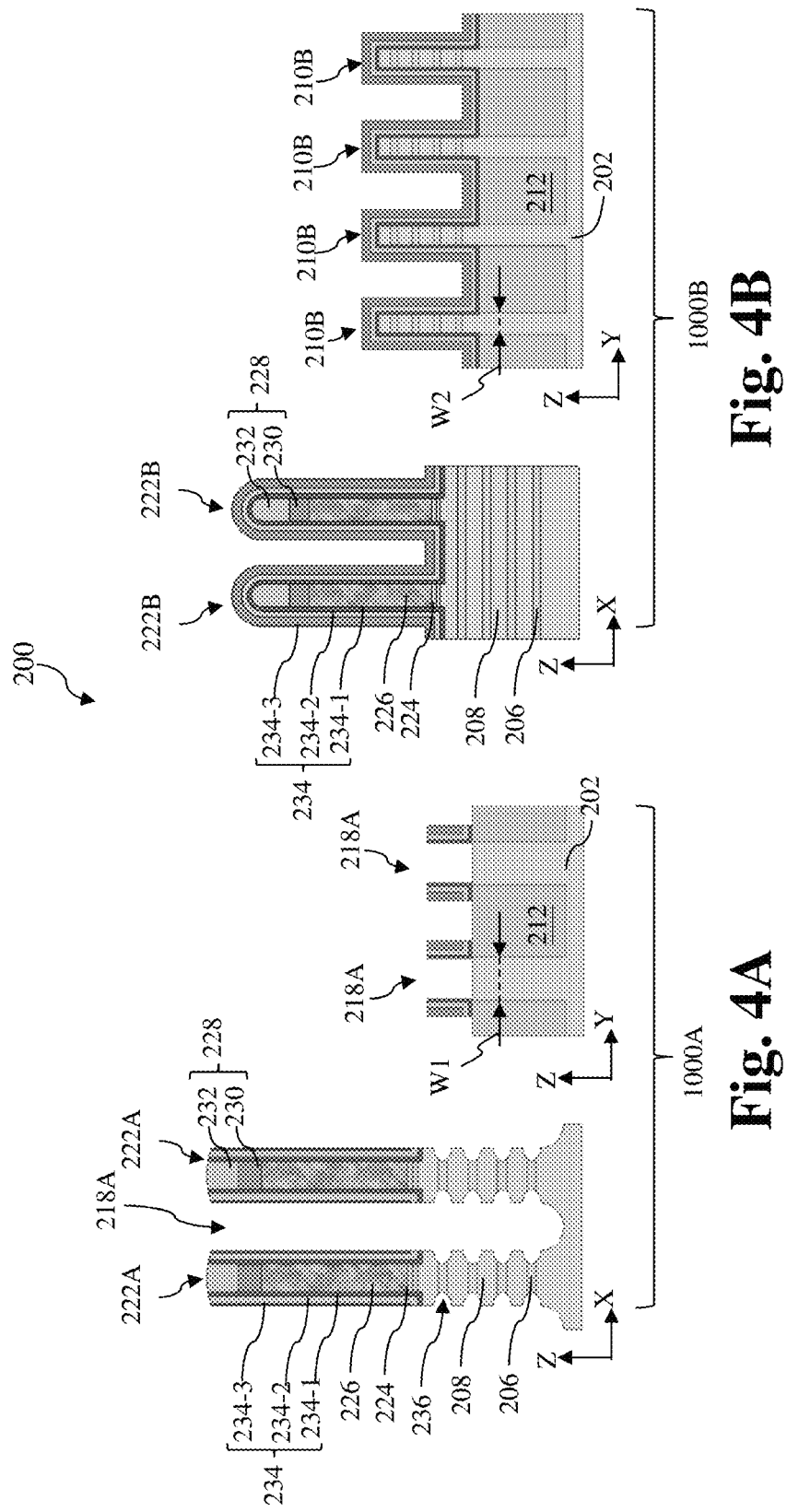

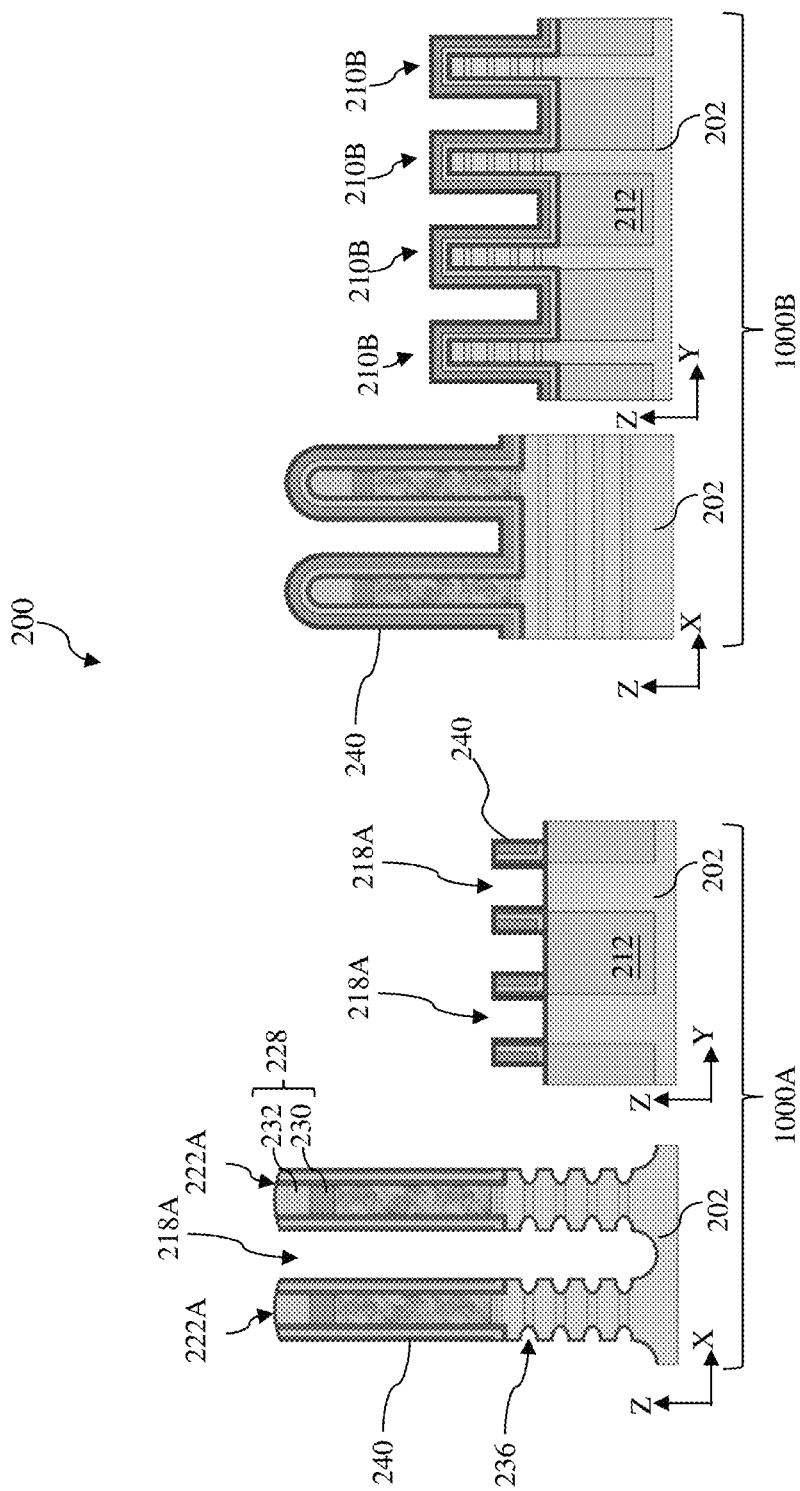

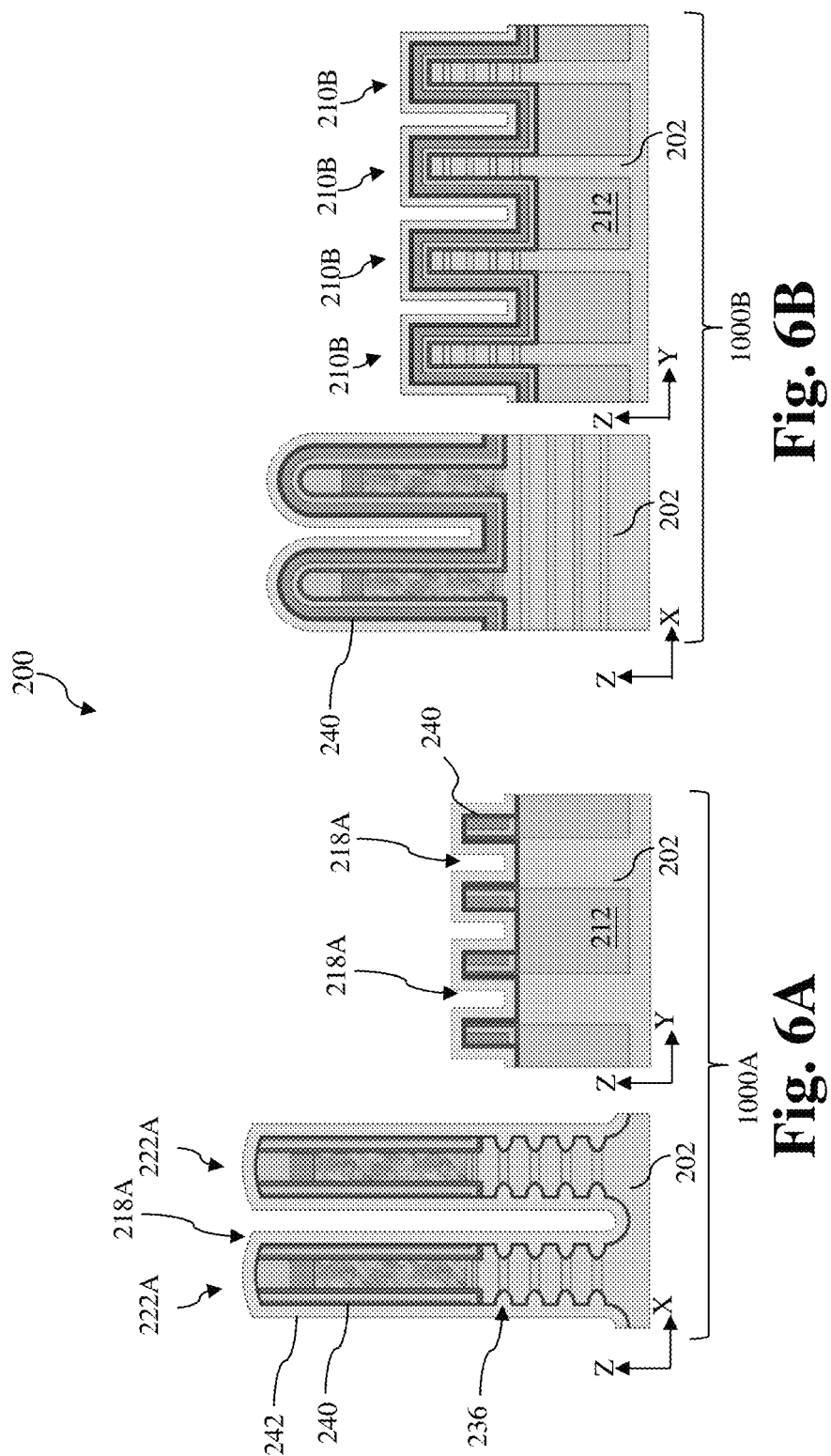

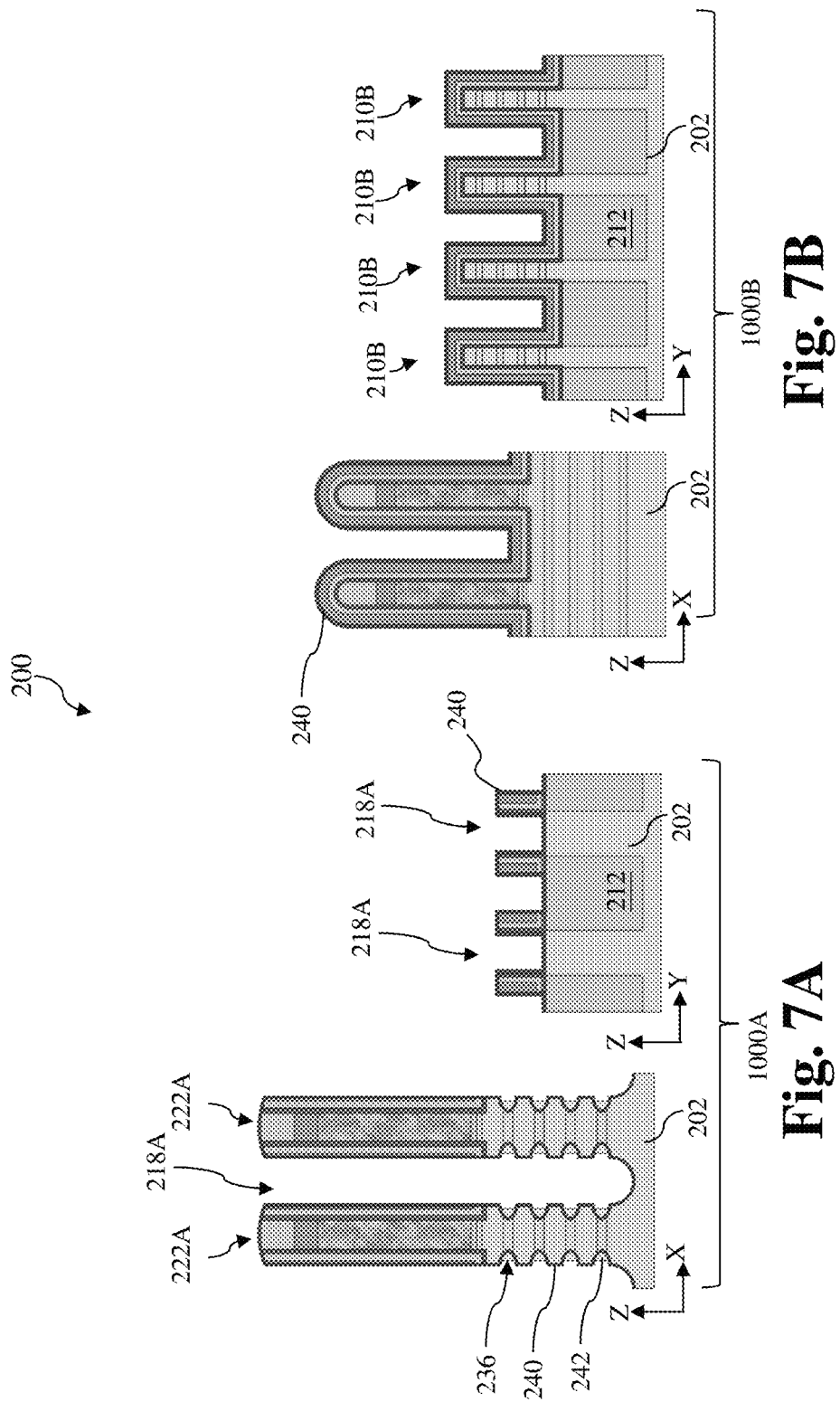

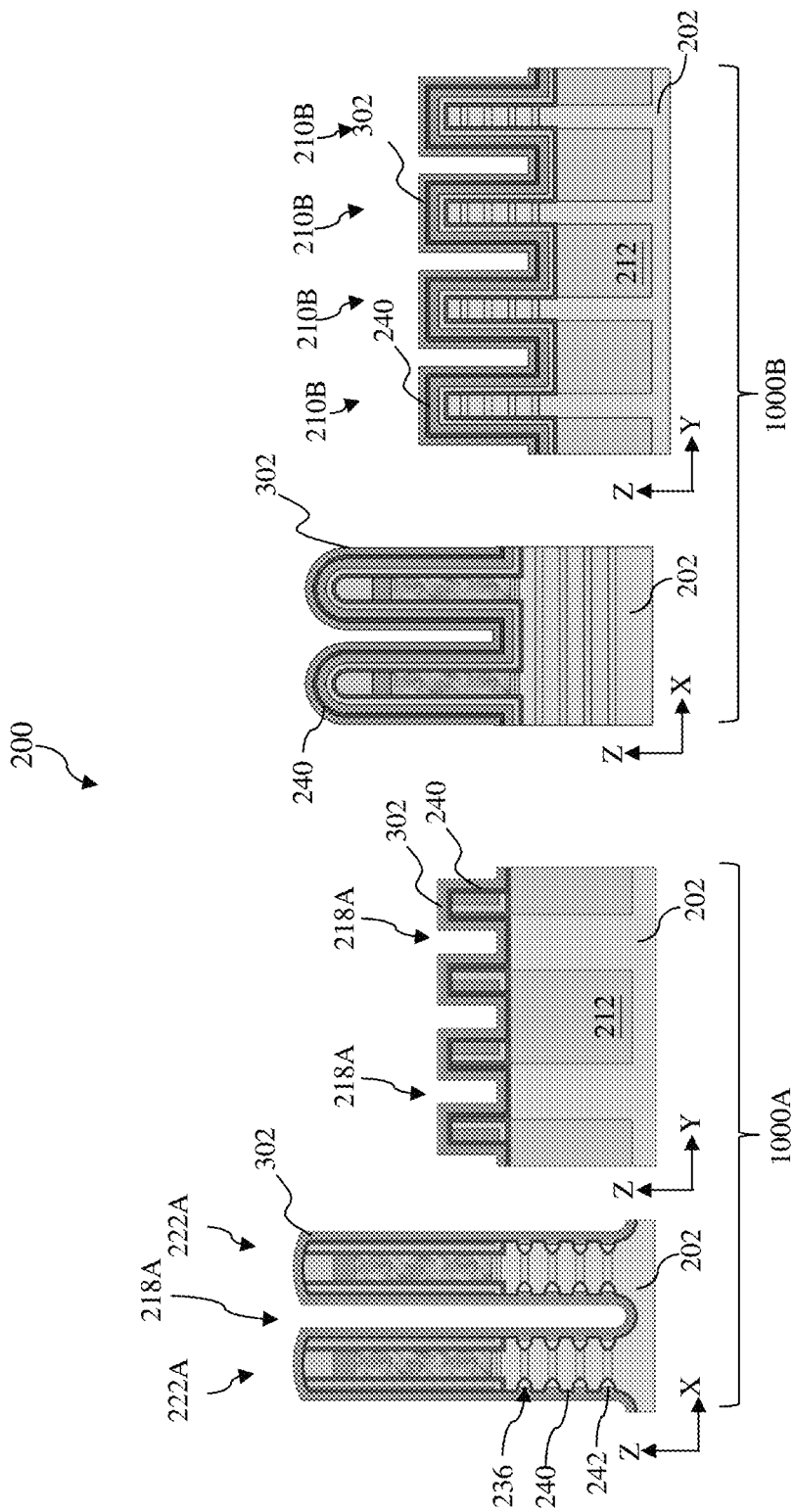

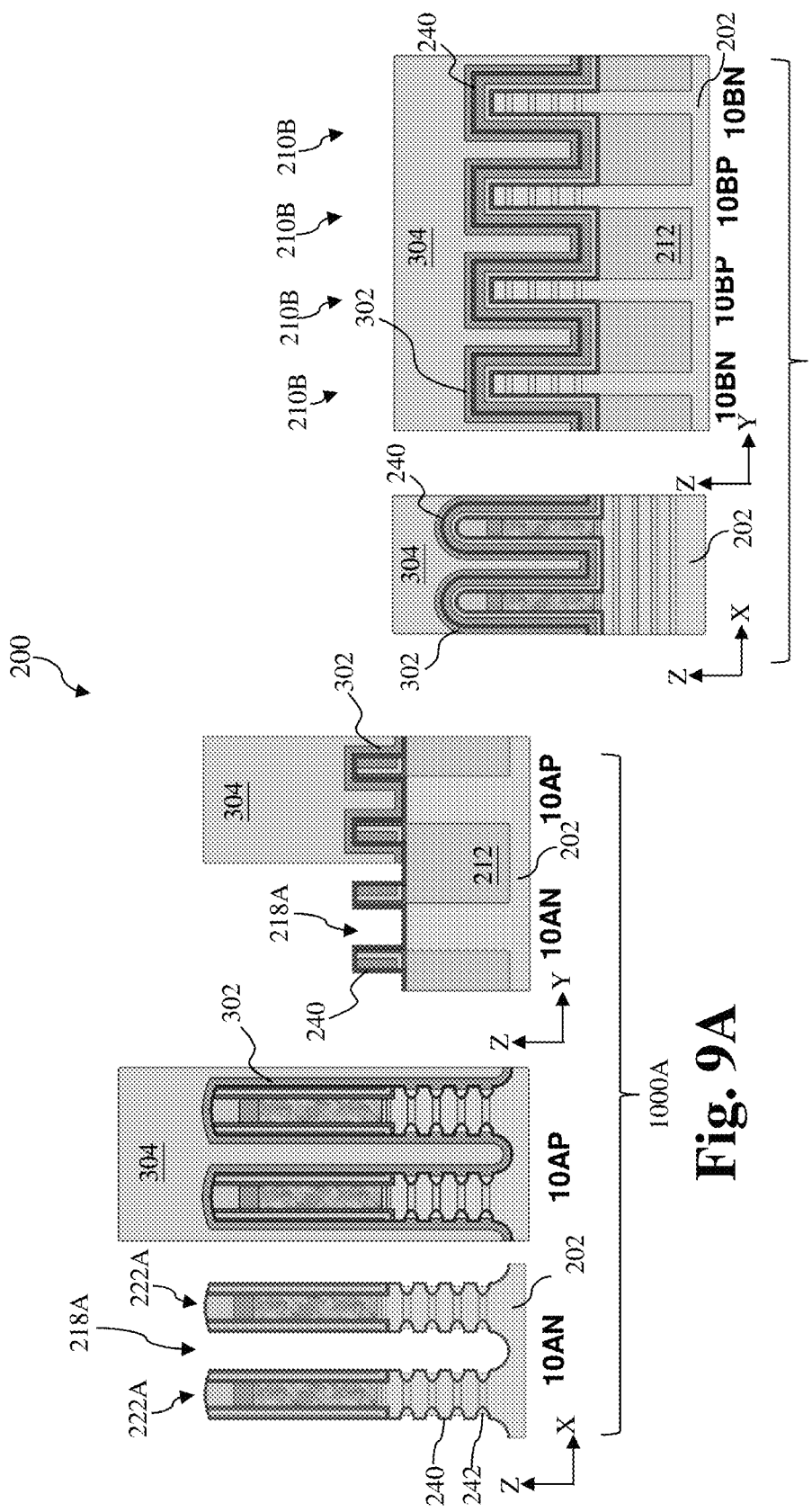

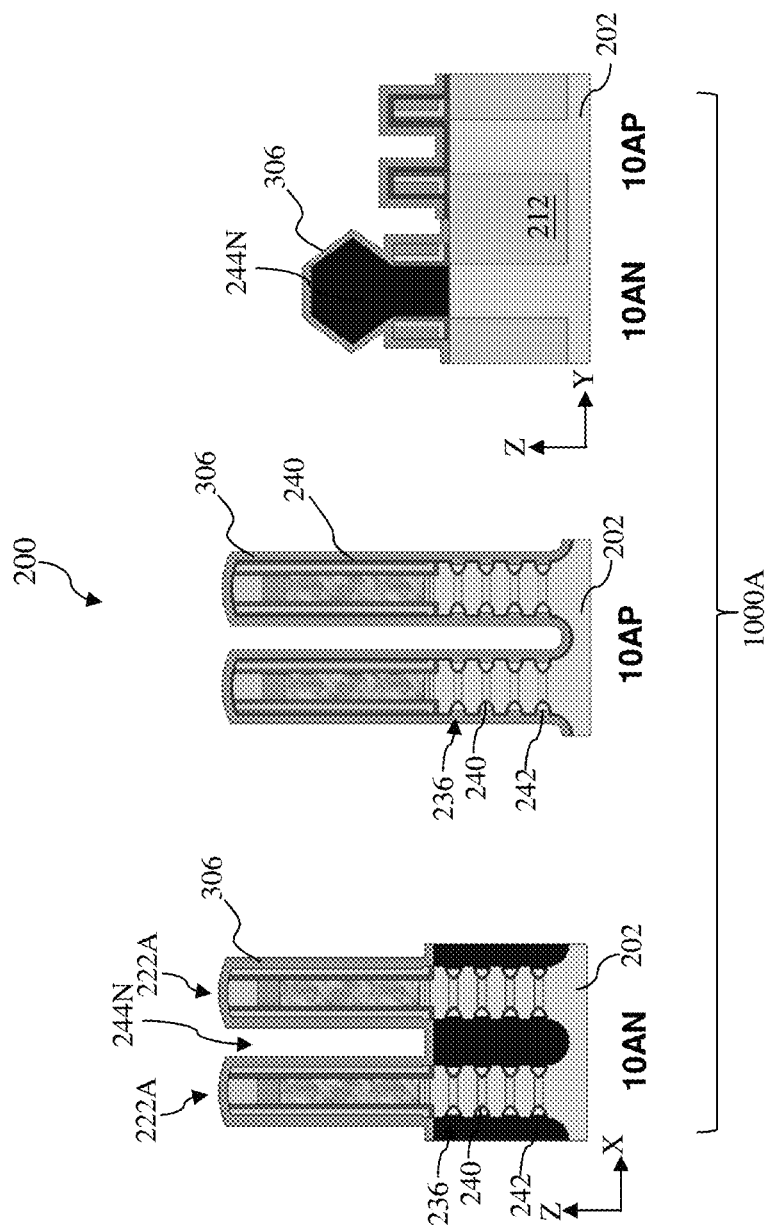

SELECTIVE INNER SPACER IMPLEMENTATIONS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as nonplanar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanostructures (which extend horizontally, thereby providing horizontally-oriented channels) that are vertically stacked. Such GAA transistor can be referred to as a vertically-stacked horizontal GAA (VGAA) transistor.

In GAA devices, inner spacers have been used to reduce capacitance and leaking between gate structures and source/drain features. Although conventional GAA devices with inner spacers have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-20A and 2B-20B illustrate cross-sectional views of a workpiece during a fabrication process according to the method of FIG. 1, according to one or more aspects of the present disclosure.

DETAILED DESCRIPTION

Figure 1A:
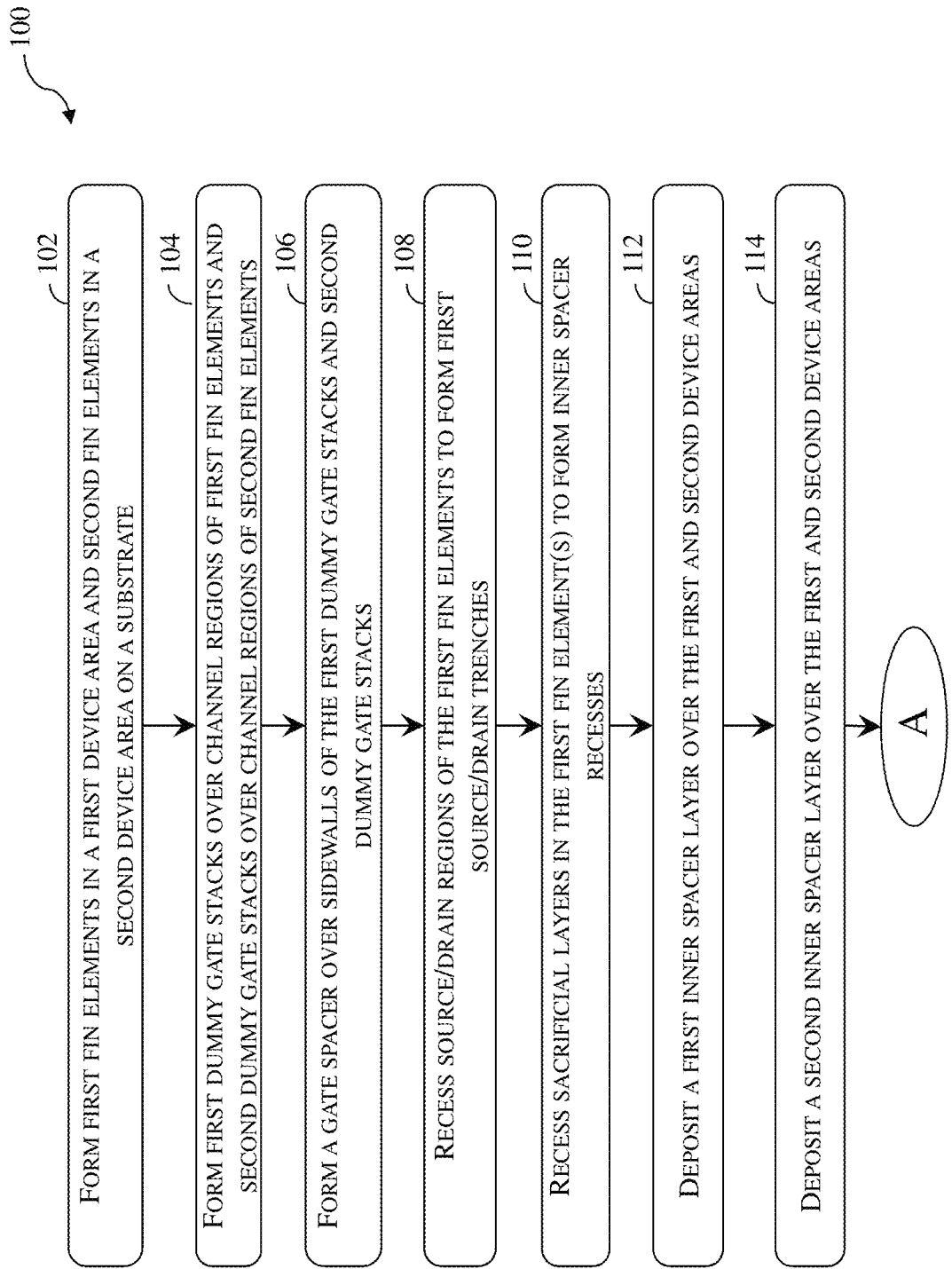
FIGS. 1A, 1B and 1C collectively illustrate a flow chart of a method for forming a semiconductor device having multiple device areas, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to inner spacer formation when fabricating gate-all-around (GAA) transistors in different device regions of a semiconductor device.

Multi-gate transistors include those transistors whose gate structures are formed on at least two-sides of a channel region. These multi-gate devices may include a p-type metal-oxide-semiconductor device or an n-type metal-oxide-semiconductor device. Examples of multi-gate transistors include FinFETs, on account of their fin-like structure and gate-all-around (GAA) devices. A GAA device includes any device that has its gate structure, or portion thereof, formed on 4-sides of a channel region (e.g., surrounding a portion of a channel region). Embodiments of the present disclosure may have channel regions disposed in nanowire channel(s), bar-shaped channel(s), nanosheet channel(s), nanostructure channel(s), column-shaped channel(s), post-shaped channel(s), and/or other suitable channel configurations. Devices according to the present disclosure may have one or more channel regions (e.g., nanowires, nanosheets, nanostructures) associated with a single, contiguous gate structure. However, one of ordinary skill would recognize that the teachings in the present disclosure may be applicable to a single channel (e.g., single nanowire, single nanosheet, single nanostructure) or any number of channels.

One of ordinary skill in art may recognize other examples of semiconductor devices that may benefit from aspects of the present disclosure.

As scales of the fin width in FinFETs decreases, channel width variations could cause undesirable variability and mobility loss. GAA transistors are being studied as an alternative to FinFETs. In a GAA transistor, the gate of the transistor is made all around the channel such that the channel is surrounded or wrapped by the gate. Such a transistor has the advantage of improving the electrostatic control of the channel by the gate, which also mitigates leakage currents. A GAA transistor includes various spacers, such as inner spacers and gate spacers (also termed as outer spacers, top spacers or main spacers). Inner spacers serve to reduce capacitance and prevent leaking between gate structure and source/drain features. The integration of inner spacers in a GAA transistor is not without its challenges. For example, fin sidewalls defining a source/drain trench of a fin active region (that includes multiple nanostructures) have been used to prevent adjacent epitaxial source/drain features from merging, especially when the width and spacing of fin active regions are on the decrease. When the width of the fin active regions is reduced to a certain level, such as below about 16 nm or about 14 nm, the process for inner spacer formation may cause inner spacer material to be deposited into the source/drain trench. It can be difficult to remove the inner spacer material deposited in the source/drain trench in inner spacer recess processes without causing damages to other structures. Any unremoved inner spacer material in the source/drain trench may hinder or even prevent formation of epitaxial source/drain features in the source/drain trench, resulting in defective epitaxial source/drain features. The present disclosure provides embodiments of selective inner spacer implementation where inner spacers are implemented in a first device area that includes devices having a first fin width but are not implemented in a second device area that includes devices having a second fin width smaller than the first width. In some applications, the first device area may be appropriate for logic devices and the second device area may be appropriate for memory devices, such as static random access memory (SRAM) devices.

Figure 1B:
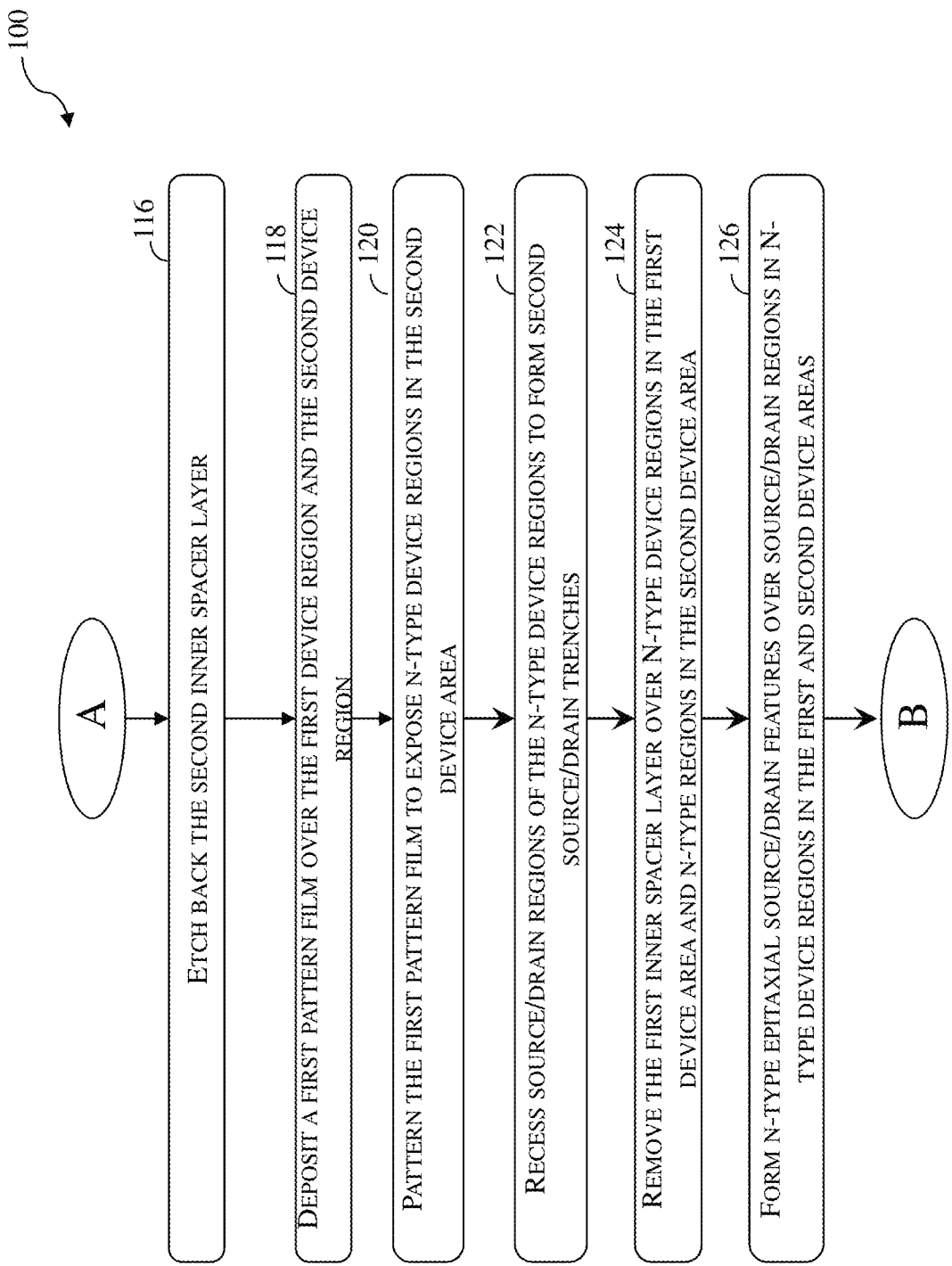
Figure 1C:
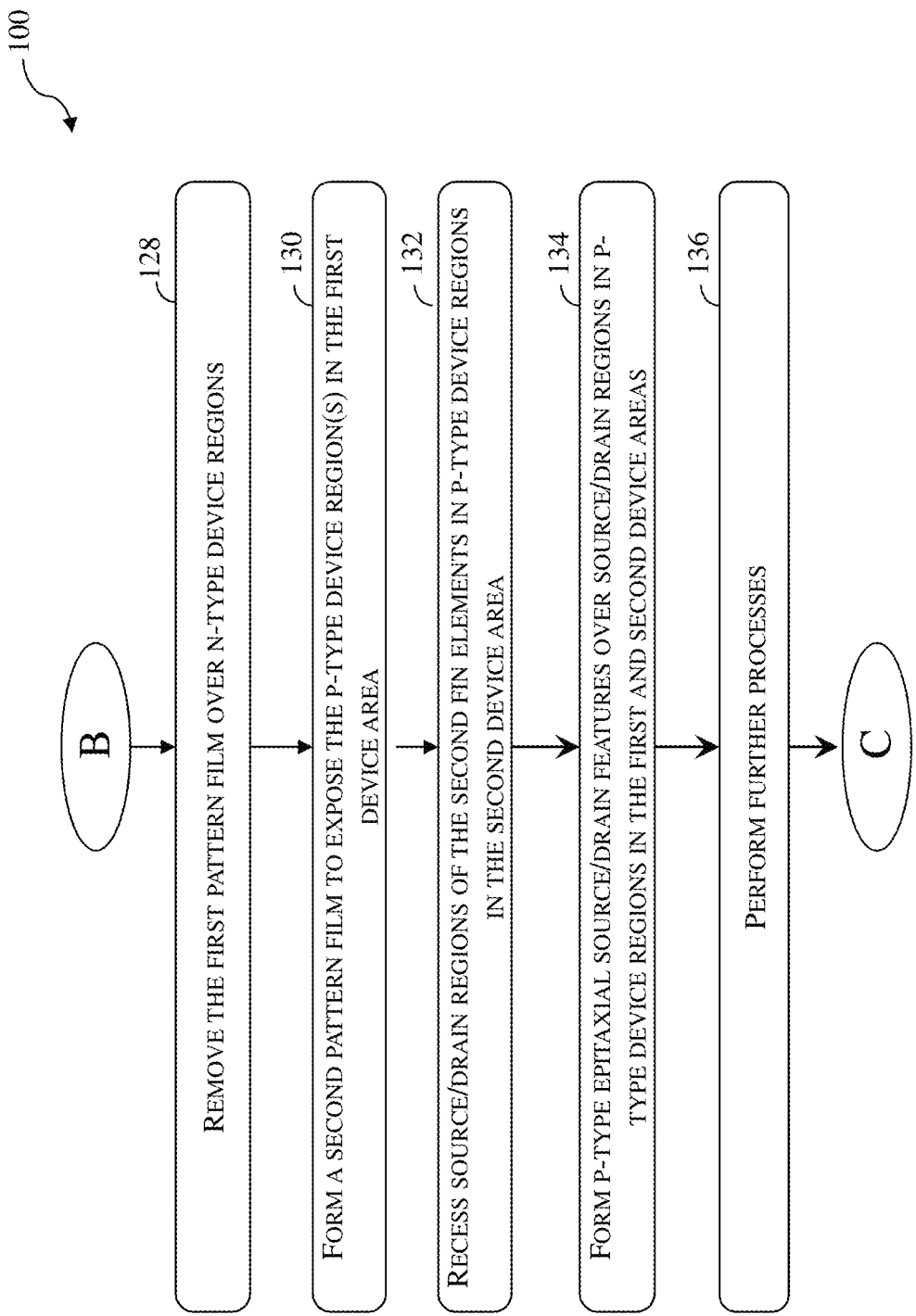

Illustrated in FIGS. 1A-1C is a method 100 of forming a semiconductor device having multiple device areas of multi-gate devices. As used herein, the term "multi-gate device" is used to describe a device (e.g., a semiconductor device) that has at least some gate material disposed on multiple sides of at least one channel of the device. In some examples, the multi-gate device may be referred to as a GAA device having gate material disposed on at least four sides of at least one channel of the device. The channel region may be referred to as a nanowire, nanosheet, nanostructure, channel member, semiconductor channel member, which, as used herein, includes channel regions of various geometries (e.g., cylindrical, bar-shaped, sheet-shaped) and various dimensions.

As with the other method embodiments and exemplary devices discussed herein, it is understood that parts of the workpiece 200 illustrated in FIGS. 2A-20A and 2B-20B may be fabricated by a CMOS technology process flow, and thus some processes are only briefly described herein. Upon conclusion of the fabrication process, the workpiece 200 will be fabricated into a semiconductor device 200. In that sense, the workpiece 200 and the semiconductor device 200 may be used interchangeably. Further, the exemplary semiconductor devices may include various other devices and features, such as other types of devices including additional transistors, bipolar junction transistors, resistors, capacitors, inductors, diodes, fuses, SRAM and/or other logic circuits, etc., but is simplified for a better understanding of the inventive concepts of the present disclosure. In some embodiments, the exemplary devices include a plurality of semiconductor devices (e.g., transistors), including n-type GAA transistors, p-type GAA transistors, PFETs, NFETs, etc., which may be interconnected. Moreover, it is noted that the process steps of method 100, including any descriptions given with reference to FIGS. 2A-19B, as with the remainder of the method and exemplary figures provided in this disclosure, are merely exemplary and are not intended to be limiting beyond what is specifically recited in the claims that follow.

A figure ending with A, such as FIGS. 2A-20A, illustrates a fragmentary cross-sectional view of a first device area of the workpiece 200 (or the semiconductor device 200). A figure ending with B, such as FIGS. 2B-20B illustrates a fragmentary cross-sectional view of a second device area of the workpiece 200. As will be described below, GAA transistors in the first and second device areas may have different structures, undergo different formation processes, and/or be commissioned for different applications. In each of FIGS. 2A-20A, at least one cross-sectional view along the X direction is shown on the left-hand side and a cross-sectional view along the Y direction is shown on the right-hand side. In each of FIG. 2B-20B, at least one cross-sectional view along the X direction is shown on the left-hand side and a cross-sectional view along the Y direction is shown on the right-hand side.

Figures 2A, 2B:
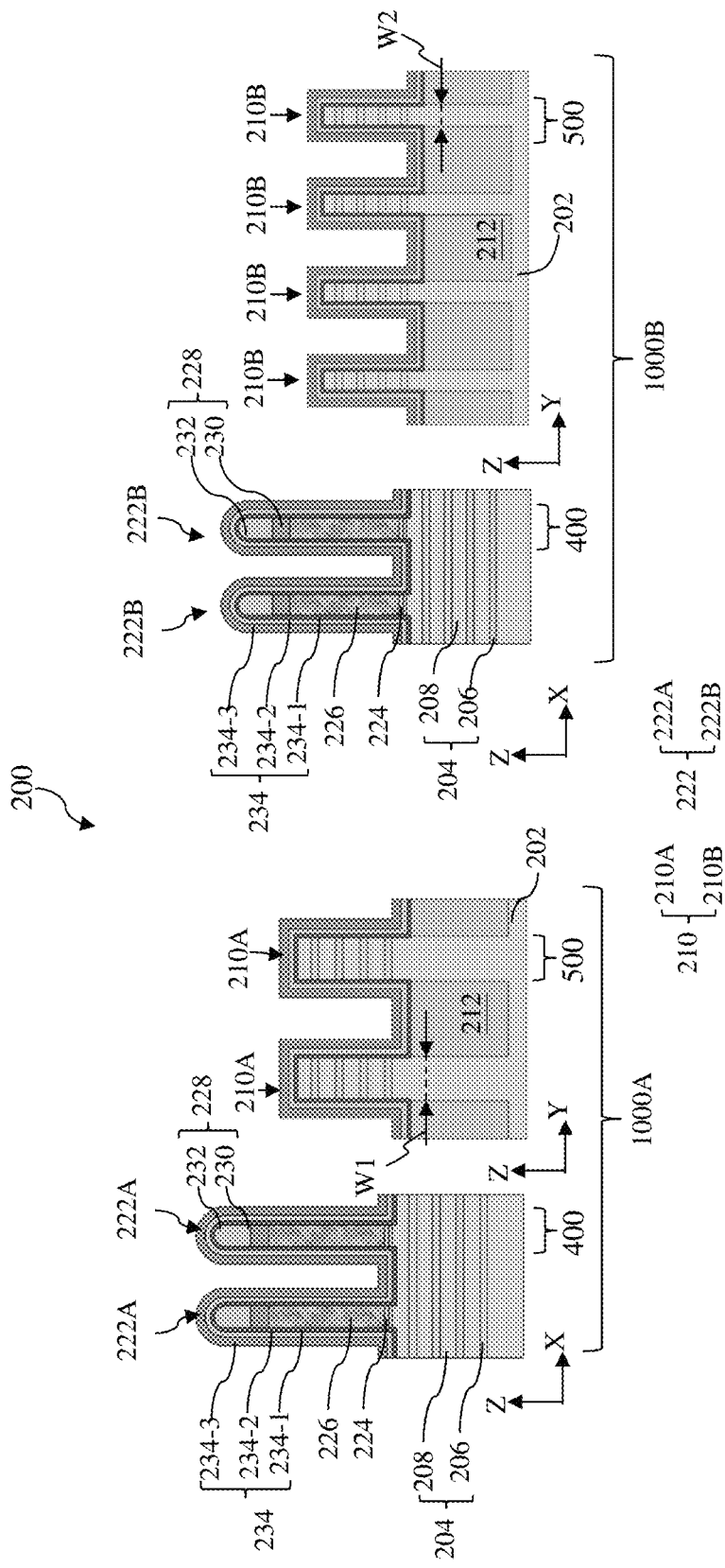

Referring to FIGS. 1A, 2A and 2B, the method 100 includes block 102 where first fin elements 210A are formed in a first device area 1000A and second fin elements 210B are formed in a second device area 1000B. Both the first device area 1000A and the second device area 1000B are disposed in a workpiece 200. The workpiece 200 includes a substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type GAA transistors, p-type GAA transistors). The suitable doping may include ion implantation of dopants and/or diffusion processes. The substrate 202 may have isolation features interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features. In an embodiment of the method 100, an anti-punch through (APT) implant is performed. The APT implant may be performed in a region underlying the channel region of a device for example, to prevent punch-through or unwanted diffusion.

The first fin elements 210A and the second fin elements 210B are formed substantially from an epitaxial stack 204 on the substrate 202. In some embodiments, the epitaxial stack 204 formed over the substrate 202 includes epitaxial layers 206 of a first semiconductor composition interposed by epitaxial layers 208 of a second semiconductor composition. The epitaxial stack 204 may also be referred to as a layer stack 204. The first and second semiconductor composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layers 206 include SiGe and the epitaxial layers 208 include Si.

It is noted that five (5) layers of the epitaxial layers 206 and four (4) layers of the epitaxial layers 208 are alternately arranged as illustrated in FIGS. 2A and 2B, which are for illustrative purposes only and not intended to be limiting beyond what is specifically recited in the claims. It can be appreciated that any number of epitaxial layers can be formed in the epitaxial stack 204. The number of layers depends on the desired number of channels members for the device 200. In some embodiments, the number of epitaxial layers 208 is between 2 and 10.

In some embodiments, each epitaxial layer 206 has a thickness ranging from about 2 nanometers (nm) to about 6 nm, such as 3 nm in a specific example. The epitaxial layers 206 may be substantially uniform in thickness. In some embodiments, each epitaxial layer 208 has a thickness ranging from about 6 nm to about 12 nm, such as 9 nm in a specific example. In some embodiments, the epitaxial layers 208 of the epitaxial stack 204 are substantially uniform in thickness. As described in more detail below, the epitaxial layers 208 or parts thereof may serve as channel member(s) for a subsequently-formed multi-gate device and the thickness is chosen based on device performance considerations. The epitaxial layers 206 in channel regions(s) may eventually be removed and serve to define a vertical distance between adjacent channel region(s) for a subsequently-formed multi-gate device and the thickness is chosen based on device performance considerations. Accordingly, the epitaxial layers 206 may also be referred to as sacrificial layers 206, and epitaxial layers 208 may also be referred to as channel layers 208.

By way of example, epitaxial growth of the layers of the epitaxial stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 208 include the same material as the substrate 202. In some embodiments, the epitaxially grown layers 206 and 208 include a different material than the substrate 202. As stated above, in at least some examples, the epitaxial layers 206 include an epitaxially grown silicon germanium (SiGe) layer and the epitaxial layers 208 include an epitaxially grown silicon (Si) layer. Alternatively, in some embodiments, either of the epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206 and 208 may be chosen based on providing differing oxidation, etching selectivity properties. In some embodiments, the epitaxial layers 206 and 208 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

At block 102, the epitaxial stack 204 over the substrate 202 is patterned to form the first fin elements 210A in the first device area 1000A and the second fin elements 210B in the second device area 1000B. The first fin elements 210A and the second fin elements 210B extend from the substrate 202. In some embodiments, the patterning also etches into the substrate 202 such that each of the first fin elements 210A and the second fin elements 210B includes a lower portion formed from the substrate 202 and an upper portion from the epitaxial stack 204. The upper portion includes each of the epitaxial layers of the epitaxial stack 204 including epitaxial layers 206 and 208. The first and second fin elements 210A and 210B may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the first fin elements 210A and the second fin elements 210B by etching the epitaxial stack 204. The etching process can include dry etching, wet etching, reactive ion etching (RIE), and/or other suitable processes.

In some embodiments represented in FIGS. 2A and 2B, devices formed in the first device area 1000A and those formed in the second device area 1000B are for different applications. In some implementations, the first device area 1000A is for applications that require faster switching and greater drive currents, such as logic devices, and the second device area 1000B is for applications that require high packing density, such as memory devices. Examples of logic devices include an inverter, NAND, NOR, AND, OR, or Flip-Flop device. Examples of memory devices include SRAM, dynamic random access memory (DRAM), and Flash devices. To accommodate these applications, each of the first fin elements 210A in the first device area 1000A may have a first width W1 between about 14 nm and about 30 nm, such as between 16 nm and 30 nm; and each of the second fin elements 210B in the second device area 1000B has a second width W2 between about 6 nm and about 16 nm, such as between 6 nm and 14 nm. As described above, switching speed is an important attribute of a device in the first device area 1000A and delay caused by parasitic capacitance between source/drain and gate is undesirable. Speed, however, is not a crucial requirement for a device in the second device area 1000B and delay caused by parasitic capacitance between source/drain and gate is of a lesser concern. Formation of inner spacers is one of the techniques to reduce parasitic capacitance. However, when fin width is reduced to a range between 14 nm and about 16 nm or below, inner spacer material may be deposited in source/drain trenches and may not be completely removed without harming other structures. A feature of embodiments of the present disclosure is that formation of inner spacer may be omitted for devices in the second device area 1000B if such omission may reduce defects and improve reliability of devices in the second device area 1000B. For example, the formation of inner spacers in densely packed second device area 1000B may be omitted if the fin width of the devices in the second device area 1000B falls below a threshold range such that formation of inner spacers does more harm than good. The threshold range is dependent on various process conditions and design attributes. An example of the threshold range is between about 14 nm and about 16 nm.

Reference is still made to FIGS. 2A and 2B. After the first fin elements 210A and the second fin elements 210B are formed, isolation feature 212 is formed between neighboring first fin elements 210A and between neighboring second fin elements 210B. The isolation feature 212 may also be referred to as a shallow trench isolation (STI) feature 212. By way of example, in some embodiments, a dielectric layer is first deposited over the substrate 202, filling the trenches between fin elements (such as the first fin elements 210A and the second fin elements 210B) with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the STI features 212. The first fin elements 210A and the second fin elements 210B rise above the STI features 212. In some embodiments, the dielectric layer (and the subsequently formed STI features 212) may include a multi-layer structure, for example, having one or more liner layers.

In some embodiments not separately illustrated in the present disclosure, dielectric fins may also be formed at block 102 of method 100. In an example process flow to form dielectric fins, a slit that extend in parallel with the first fin elements 210A is formed within the STI feature 212 and dielectric fin material is then deposited into the slit. The dielectric fin material is different from the dielectric material that forms the STI features 212. This allows the dielectric layer for the STI features 212 to be selectively etched, leaving behind the dielectric fins that rise above the STI features 212. In some embodiments, the dielectric fin material may include silicon nitride, silicon carbonitride, silicon carbide, aluminum oxide, zirconium oxide, or other suitable materials. In embodiments where dielectric fins are deployed, dielectric fins interpose between the first fin elements 210A or the second fin elements 210B and serve to separate source/drain features of neighboring devices. The dielectric fins may also be referred to as dummy fins or hybrid fins. In some alternative embodiments, an upper portion of the dielectric fins may be removed during a gate cut process and replaced by a reverse material feature that may be different or similar to that of the dielectric fins. When formed, the dielectric fins restrict the formation of epitaxial source/drain features and prevent undesirable mergers between adjacent epitaxial source/drain features.

Referring still to FIGS. 1A, 2A and 2B, method 100 includes block 104 where first dummy gate stacks 222A are formed over channel regions 400 of the first fin elements 210A and second dummy gate stacks 222B are formed over channel regions 400 of the second fin elements 210B. For ease of reference, the first fin elements 210A and the second fin elements 210B may be collectively referred to as fin elements 210. Similarly, the first dummy gate stacks 222A and the second dummy gate stacks 222B may be collectively referred to as dummy gate stacks 222. In some embodiments, a gate replacement process (or gate-last process) is adopted where the first dummy gate stacks 222A and the second dummy gate stacks 222B serve as placeholders for high-k metal gate stacks and are to be removed and replaced by the high-k metal gate stacks. Other processes and configuration are possible. In some embodiments, the first dummy gate stacks 222A are formed over the substrate 202 and are at least partially disposed over the first fin elements 210A and the second dummy gate stacks 222B are formed over the substrate 202 and are at least partially over the second fin elements 210B. The portion of the first fin element 210A underlying the first dummy gate stack 222A is the channel region 400 of the first fin element 210A. Similarly, the portion of the second fin element 210B underlying the second dummy gate stacks 222B is the channel regions 400 of the second fin element 210B. The first and second dummy gate stacks 222A and 222B may also define source/drain (S/D) regions 500 adjacent to and on opposing sides of the channel region 400.

In the illustrated embodiment, block 104 first forms a dummy dielectric layer 224 over the fin elements 210 (including the first fin elements 210A and the second fin elements 210B). In some embodiments, the dummy dielectric layer 224 may include silicon oxide, silicon nitride, a high-K dielectric material and/or other suitable material. In various examples, the dummy dielectric layer 224 may be deposited by a CVD process, a sub-atmospheric CVD (SACVD) process, a flowable CVD process, an ALD process, a PVD process, or other suitable process. By way of example, the dummy dielectric layer 224 may be used to prevent damages to the fin elements 210 by subsequent processes (e.g., formation of the dummy gate stack). Subsequently, block 104 forms other portions of the dummy gate stacks 222, including a dummy electrode layer 226 and a hard mask 228 which may include multiple layers 230 and 232. In some embodiments, the dummy gate stack 222 is formed by various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy electrode layer 226 may include polycrystalline silicon (polysilicon). In some embodiments, the hard mask 228 includes an oxide layer 230 such as a pad oxide layer that may include silicon oxide. In some embodiments, hard mask 228 includes the nitride layer 232 such as a pad nitride layer that may include silicon nitride, silicon oxynitride and/or silicon carbide.

Still referring to FIGS. 2A and 2B, in some embodiments, after formation of the dummy gate stack 222, the dummy dielectric layer 224 is removed from the source/drain regions 500 of the fin elements 210. That is, the dummy dielectric layer 224 that is not covered by the dummy electrode layer 226 is removed. The removal process may include a wet etch, a dry etch, and/or a combination thereof. The etch process is chosen to selectively etch the dummy dielectric layer 224 without substantially etching the fin elements 210, the hard mask 228, and the dummy electrode layer 226.

Referring still to FIGS. 1A, 2A and 2B, the method 100 includes block 106 where a gate spacer 234 is formed over sidewalls of the first dummy gate stacks 222A and the second dummy gate stacks 222B. In some embodiments, spacer material for forming the gate spacer 234 is deposited conformally over the workpiece 200, including over top surfaces and sidewalls of the dummy gate stack 222 (including the first dummy gate stacks 222A and the second dummy gate stacks 222B), to form a spacer material layer. The term "conformally" may be used herein for ease of description of a layer having substantially uniform thickness over various regions. The gate spacer 234 may have a single-layer construction or include multiple layers. In some embodiments represented in FIGS. 2A and 2B, the gate spacer 234 includes a first gate spacer 234-1, a second gate spacer 234-2, and a third gate spacer 234-3. In these embodiments, the first gate spacer 234-1 may include silicon carbonitride; the second gate spacer 234-2 may include silicon oxycarbide, or other low-k dielectric layer; and the third gate spacer 234-3 may include silicon oxycarbonitride, silicon nitride, or material having a higher dielectric constant that the second gate spacer 234.2. In addition, in these embodiments, compared to the first gate spacer 234-1 and the second gate spacer 234-2, the third gate spacer 234-3 has a higher dielectric constant and greater etch resistance and may serve as a masking film or a pattern film. In later processes, the third gate spacer 234-3 with higher dielectric constant may be partially or completely removed, leaving behind the first gate spacer 234-1 and/or the second gate spacer 234-2 with lower dielectric constants. In some alternative embodiments, the gate spacer 234 may have a single layer that is formed of a dielectric material such as silicon oxide, silicon nitride, silicon carbide, silicon oxynitride, silicon carbonitride, silicon oxycarbide, silicon oxycarbonitrde, and/or combinations thereof. The spacer material layer may be deposited over the dummy gate stack 222 (including first dummy gate stacks 222A and the second dummy gate stacks 222B) using processes such as, CVD process, a subatmospheric CVD (SACVD) process, a flowable CVD process, an ALD process, a PVD process, or other suitable process. The spacer material layer is then etched back in an anisotropic etch process to form the gate spacers 234. The anisotropic etch process exposes portions of the fin elements 210 (including the first fin elements 210A and the second fin elements 210B) adjacent to and not covered by the dummy gate stack 222 (e.g., in source/drain regions). Portions of the spacer material layer directly above the dummy gate stack 222 may be completely removed by this anisotropic etching process while the gate spacers 234 remain on sidewalls of the dummy gate stack 222.

Referring to FIGS. 1A, 3A and 3B, the method 100 includes block 108 where source/drain regions 500 of the first fin elements 210A are recessed to form first source/drain trenches 218A. While not explicitly shown, a photolithography process and at least one hard mask may be used to perform operations at block 108. In some embodiments, the portions of the first fin elements 210A that are not covered by the first dummy gate stack 222A and the gate spacers 234 are etched by a dry etch or a suitable etching process to form the first source/drain trench 218A. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments represented in FIGS. 3A and 3B, the upper portion of the first fin element 210A is recessed to expose the sacrificial layers 206 and the channel layers 208. In some implementations, at least a portion of the lower portion of the first fin elements 210A are recessed as well. That is, the first source/drain trench 218A may extend below the bottommost sacrificial layer 206. Upon conclusion of operations in block 108, the source/drain regions 500 of the first fin elements 210A may become level with to or lower than the top surface of the STI features 212. As shown in FIG. 3B, the third gate spacer 234-3 may be patterned by photolithography to cover the second device area 1000B while leaving the first device area 1000A exposed to undergo operations at block 108. The remaining gate spacer 234 that defines the first source/drain trench 218A may be referred to as a first fin sidewall 235. In some instances, the first fin sidewall 235 has a first height H1 between about 0 nm and about 40 nm.

Referring to FIGS. 1A and 4A, the method 100 includes block 110 where the sacrificial layers 206 in the first fin elements 210A are recessed to form inner spacer recesses 236 in the first device area 1000A. It is noted that, in embodiments represented in FIG. 4B, the second device area 1000B remains masked by the patterned third gate spacer 234-3 such that the first device area 1000A is exposed to undergo operations at block 110. In some embodiments represented in FIG. 4A, the sacrificial layers 206 exposed in the first source/drain trench 218A are selectively and partially recessed to form inner spacer recesses 236 while the exposed channel layers 208 are substantially unetched. In an embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 206 are recessed is controlled by duration of the etching process. In some embodiments, the selective dry etching process may include use of one or more fluorine-based etchants, such as fluorine gas or hydrofluorocarbons. As shown in FIG. 4A, the inner spacer recesses 236 extend inward from the first source/drain trench 218A. In some embodiments, the selective wet etching process may include a hydro fluoride (HF) or $NH_4OH$ etchant. As shown in FIG. 4A, the inner spacer recesses 236 extend inward from the first source/drain trench 218A.

Referring to FIGS. 1A, 5A and 5B, the method 100 includes a block 112 where a first inner spacer layer 240 is deposited over the first device area 1000A and the second device area 1000B. The first inner spacer layer 240 may be deposited by CVD, PECVD, LPCVD, ALD or other suitable method. In some instances, the first inner spacer layer 240 is formed to a thickness between about 1 nm and about 3 nm. With respect to the first device area 1000A shown in FIG. 5A, the first inner spacer layer 240 functions to protect the gate spacers 234, the hard mask 228, and the channel layers 208 from damages during pull back (etch back) of inner spacers. With respect to the second device area 1000B shown in FIG. 5B, the first inner spacer layer 240 is deposited over the third gate spacer 234-3. In some implementations, the first inner spacer layer 240 may be formed of metal oxides or carbon-rich silicon carbonitride. The metal oxides here may include aluminum oxide, zirconium oxide, tantalum oxide, yttrium oxide, titanium oxide, lanthanum oxide, or other suitable metal oxide. The carbon-rich silicon carbonitride may include a carbon content greater than 5%. In embodiments represented in FIG. 5A, the first inner spacer layer 240 may be deposited conformally over the top surface of the hard mask 228, top surfaces and sidewalls of the gate spacers 234, portions of the substrate 202 exposed in the first source/drain trench 218A. In embodiments where a dielectric fin is formed, the first inner spacer layer 240 may also be deposited conformally over top surface and sidewalls of the dielectric fin.

Referring to FIGS. 1A, 6A and 6B, the method 100 includes a block 114 where a second inner spacer layer 242 is deposited over the first device area 1000A and the second device area 1000B. In some embodiments, the second inner spacer layer 242 may be deposited by CVD, PECVD, LPCVD, ALD or other suitable method. In some instances, the second inner spacer layer 242 may be formed to a thickness between about 3 nm and about 5 nm. With respect to the first device area 1000A shown in FIG. 6A, because the inner spacer recesses 236 are not filled by the first inner spacer layer 240, the second inner spacer layer 242 is also deposited into the inner spacer recesses 236. With respect to the second device area 1000B shown in FIG. 6B, the second inner spacer layer 242 may be deposited over the first inner spacer layer 240. In some implementations, the second inner spacer layer 242 may be formed of silicon oxide, silicon oxycarbonitride, silicon oxycarbide, or other low-k material. The second inner spacer layer 242 may be porous to further reduce the dielectric constant. In some instances, the carbon content of the second inner spacer layer 242 is smaller than the carbon content of the first inner spacer layer 240.

Referring to FIGS. 1B, 7A and 7B, the method 100 includes a block 116 where the second inner spacer layer 242 is pulled back (etched back). In some embodiments, the second inner spacer layer 242 is isotropically and selectively etched back until the second inner spacer layer 242 is completely removed from the top surfaces of the hard mask 228, top surfaces and sidewalls of the gate spacers 234, portions of the substrate 202 exposed in the first source/drain trench 218A, and top surfaces and sidewalls of the dielectric fins (if present) in the first device area 1000A and from the first inner spacer layer 240 in the second device area 1000B. As described above, the composition of the first inner spacer layer 240 is different from the composition of the second inner spacer layer 242 such that the second inner spacer layer 242 may be selectively etched while the first inner spacer layer 240 experiences a slow etch rate. In some implementations, at block 116, the etch selectivity of the second inner spacer layer 242 to the first inner spacer layer 240 is greater than 5. In some implementations, the isotropic etch performed at block 118 may include use of hydrogen fluoride, fluorine gas, hydrogen, ammonia, nitrogen trifluoride, or other fluorine-based etchants. In some embodiments represented in FIGS. 8A and 8B, the second inner spacer layer 242 in the inner spacer recesses 236 is etched such that an outer surface of the second inner spacer layer 242 is not coplanar with the sidewalls of the gate spacers 234. In an alternative embodiment of the present disclosure, the formation of the first inner spacer layer 240 may be omitted and the devices in the first device area 1000A may only include the second inner spacer layer 242 in the inner spacer recesses 236.

Referring to FIGS. 1B, 8A, and 8B, the method 100 includes block 118 where a first pattern film 302 is deposited over the first device area 1000A and the second device area 1000B. In some embodiments, as will be clear from the descriptions below, the first pattern film 302 may be patterned at block 120 to function as a mask to apply different process treatments to different types of devices. In some embodiments, the first pattern film 302 may include silicon nitride or silicon carbonitride. This arrangement allows the first pattern film 302 to be selectively removed later on without substantially damaging the first inner spacer layer 240. In some implementations, the first pattern film 302 may be deposited using CVD, PECVD, LPCVD, ALD or other suitable method. In some instances, the first pattern film 302 may be formed to a thickness between about 3 nm and about 5 nm.

Referring to FIGS. 1B, 9A and 9B, the method 100 may include patterning the first pattern film 302 to expose an n-type device region 10AN in the first device area 1000A. In some embodiments shown in FIG. 9A, photolithography techniques are used to pattern the first pattern film 302. A first photoresist layer 304 is deposited over the workpiece 200 by, for example, spin-on coating. The first photoresist layer 304 is then exposed to a patterned radiation, post-baked, and developed to form a patterned first photoresist layer 304 that exposes the n-type device region 10AN in the first device area 1000A while masking the p-type device region 10AP and the second device area 1000B. The exposed first pattern film 302 over the n-type device region 10AN may then be removed by a suitable etch process, exposing the first inner spacer layer 240 and the second inner spacer layer 242 in the inner spacer recesses 236.

Figures 10A, 10B:
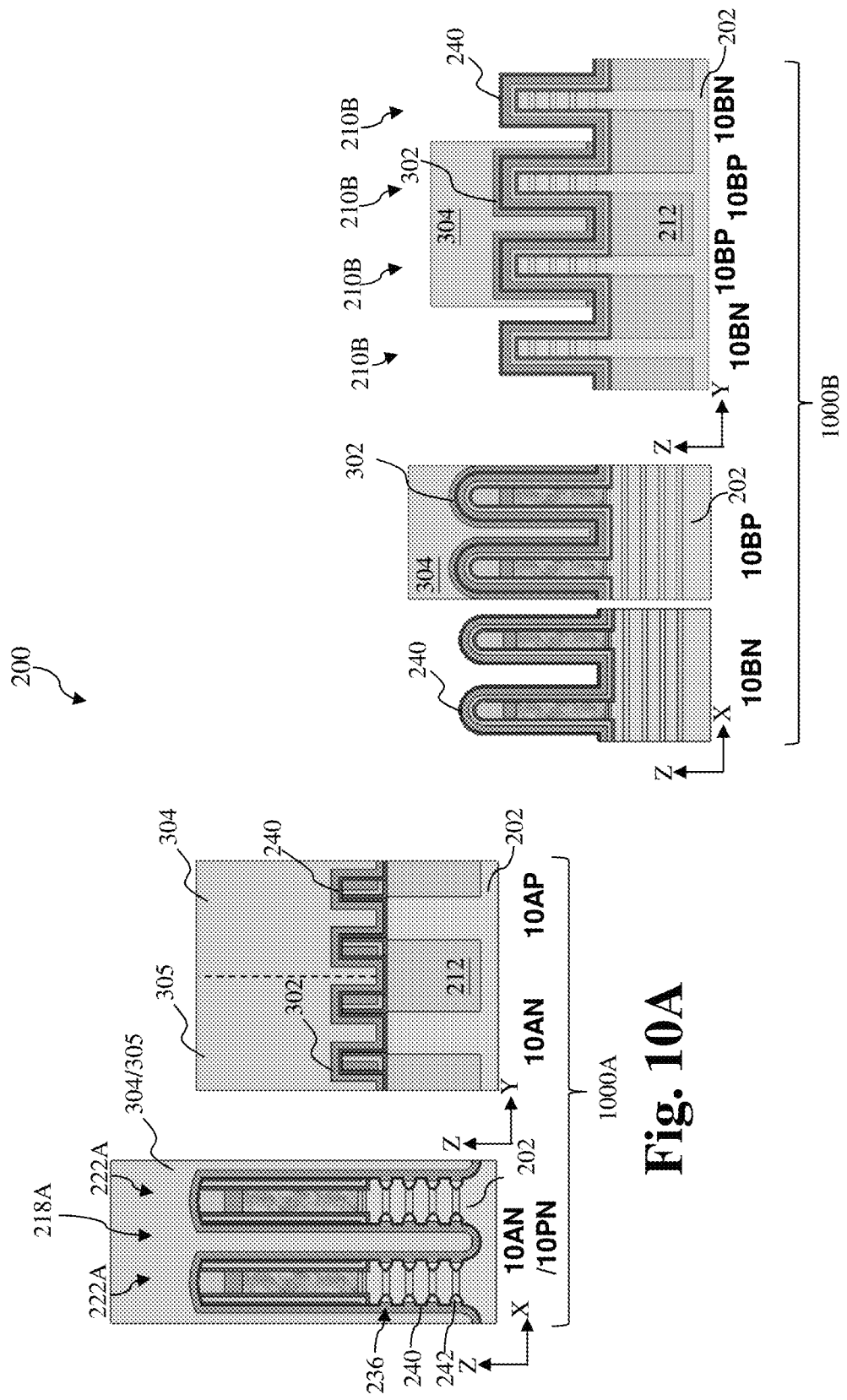

Referring to FIGS. 1B, 10A and 10B, the method 100 includes block 120 where the first pattern film 302 is patterned to expose an n-type device region 10BN in the second device area 1000B. In some embodiments shown in FIG. 10A, a first supplemental photoresist layer 305 is deposited to mask the exposed n-type device region 10AN in the first device area 1000A before operations at block 120 commence. For simplicity, the photoresist layers that mask the first device area 1000A is denoted as 304/305. A photolithography process is then performed to expose the n-type device region 10BN in the second device area.

Figures 11A, 11B:
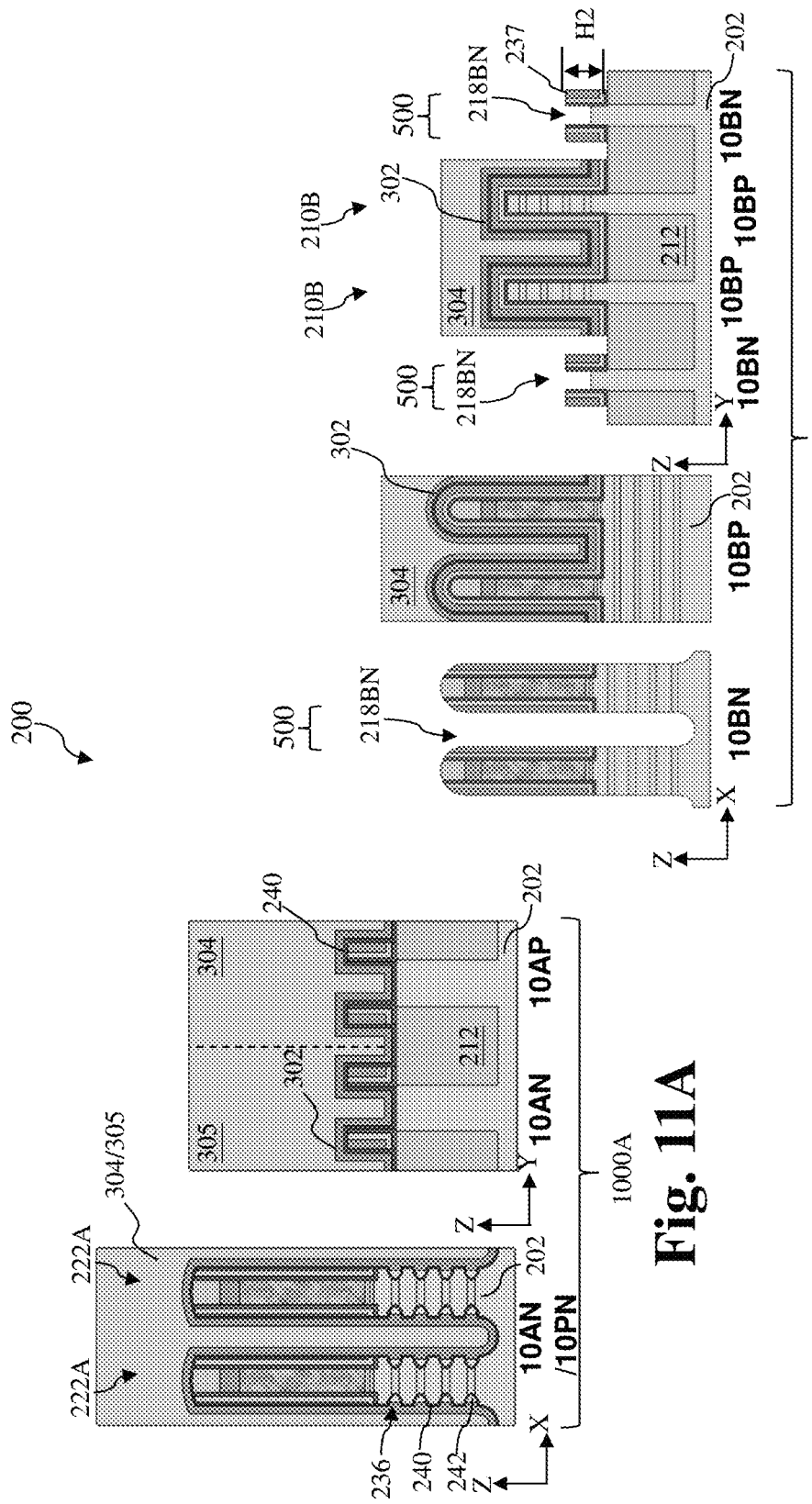

Referring to FIGS. 1B, 11A and 11B, the method 100 includes block 122 where source/drain regions 500 of the n-type device region 10BN in the second device area 1000B is recessed to form a second source/drain trench 218BN. In some embodiments, the portions of the second fin elements 210B that are not covered by the second dummy gate stack 222B and the gate spacers 234 are etched by a dry etch or a suitable etching process to form the second source/drain trench 218BN. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments represented in FIG. 11B, the upper portion of the second fin element 210B is recessed to expose the sacrificial layers 206 and the channel layers 208. In some implementations, at least a portion of the lower portion of the second fin elements 210B are recessed as well. That is, the second source/drain trench 218BN may extend below the bottom-most sacrificial layer 206. The remaining gate spacer 234 that defines the second source/drain trench 218BN may be referred to as a second fin sidewall 237. In some instances, the second fin sidewall 237 has a second height H2 between about 15 nm and about 40 nm.

In some embodiments not separately illustrated in the present disclosure, the exposed sacrificial layers 206 and the channel layers 208 in the second device area 1000B in FIG. 11B may be isotropically and selectively trimmed until sidewalls of the exposed sacrificial layers 206 and the channel layers 208 are recessed and no longer flush with sidewalls of the gate spacer 234. A silicon layer may then be epitaxially grown over the recessed sidewalls of the exposed sacrificial layers 206 and the channel layers 208 to form a regrown epitaxial silicon layer that is substantially flush with the sidewalls of the gate spacer 234 in the n-type device region 10BN in the second device area 1000B. In some implementations, the regrown epitaxial silicon layer may be doped with carbon for the n-type device regions 10BN. In these embodiments, the trimming helps increase volume of n-type epitaxial source/drain features to ensure sufficient stress is exerted on the channel members and the regrown epitaxial silicon layer reduces leakage and increases reliability of the channel members.

Figure 12A:
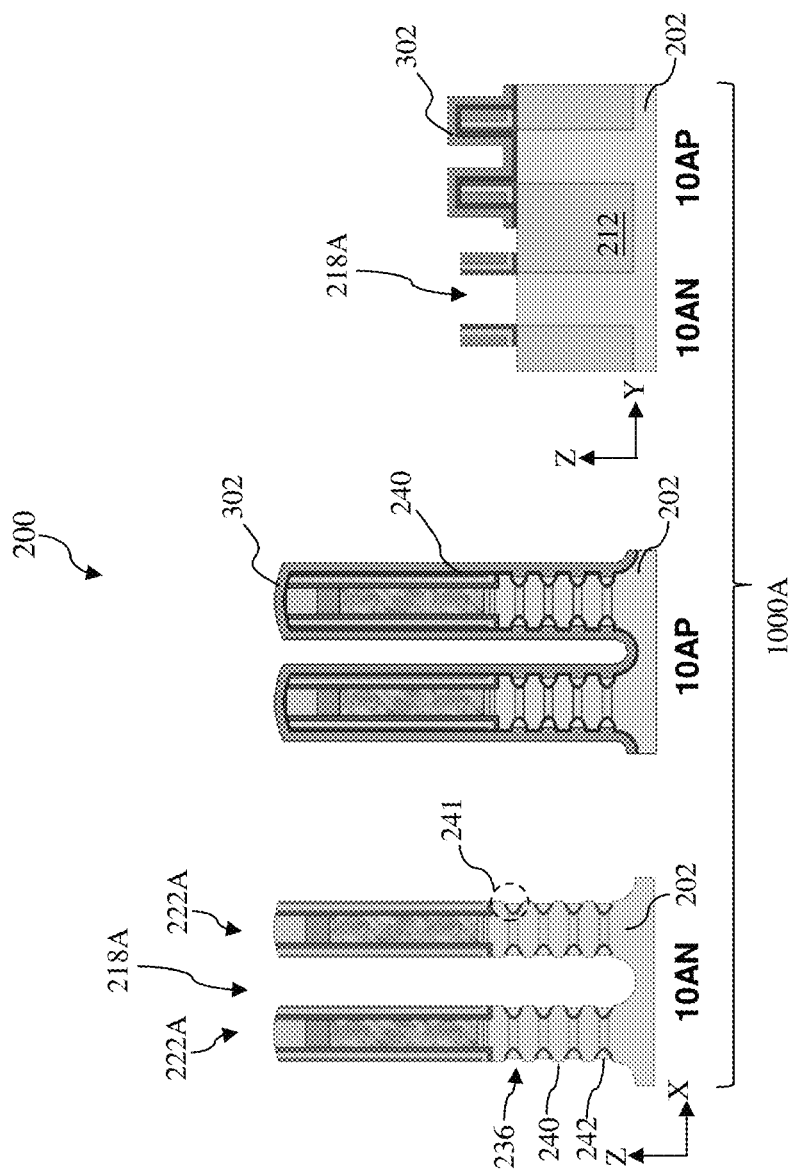
Figure 12B:
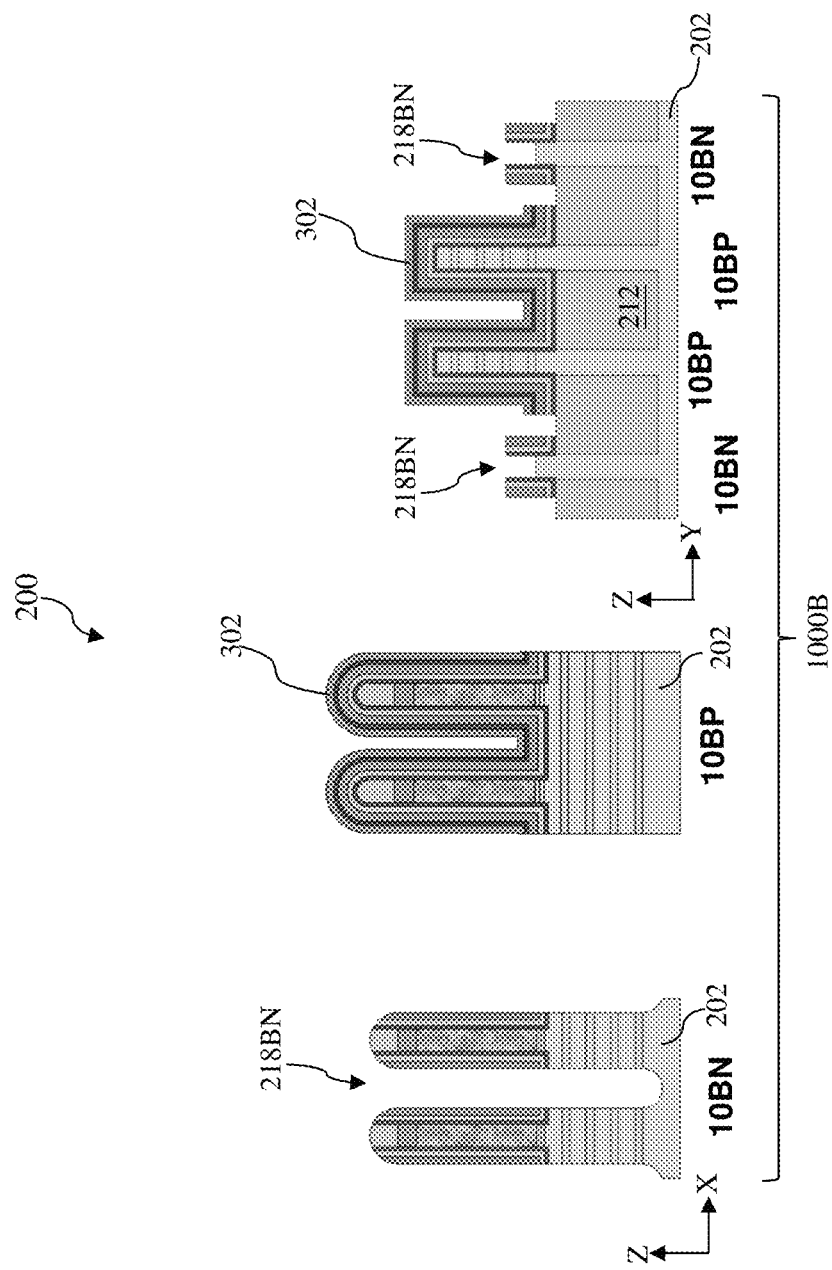

Referring to FIGS. 1B, 12A and 12B, the method 100 includes block 124 where the first inner spacer layer 240 over the n-type device region 10AN in the first device area 1000A and the n-type device region 10BN in the second device area 1000B are removed. In some embodiments, the first inner spacer layer 240 over the n-type device region 10AN in the first device area 1000A and the n-type device region 10BN in the second device area 1000B may be removed by a wet clean process or a suitable method. In some implementations, the wet clean process may include use of SPM (sulfuric acid and hydrogen peroxide mixture) solution, SC-1 (RCA Standard Clean-1) solution, or SC-2 (RCA Standard Clean-2) solution. In some instances, the wet clean process at block 124 simultaneously remove the first inner spacer layer 240 over the n-type device region 10AN in the first device area 1000A and the n-type device region 10BN in the second device area 1000B as well as the first photoresist layer 304 and the first supplemental photoresist layer 305. In other instances, the wet clean process at block 124 is a standalone process that is performed after the first photoresist layer 304 and the first supplemental photoresist layer 305 are removed in a separate process. It is noted that the first inner spacer layer 240 over the p-type device region 10AP in the first device area 1000A and the p-type device region 10BP in the second device area 1000B remain masked by the first pattern film 302 and are not etched at block 124.

Figure 13A:
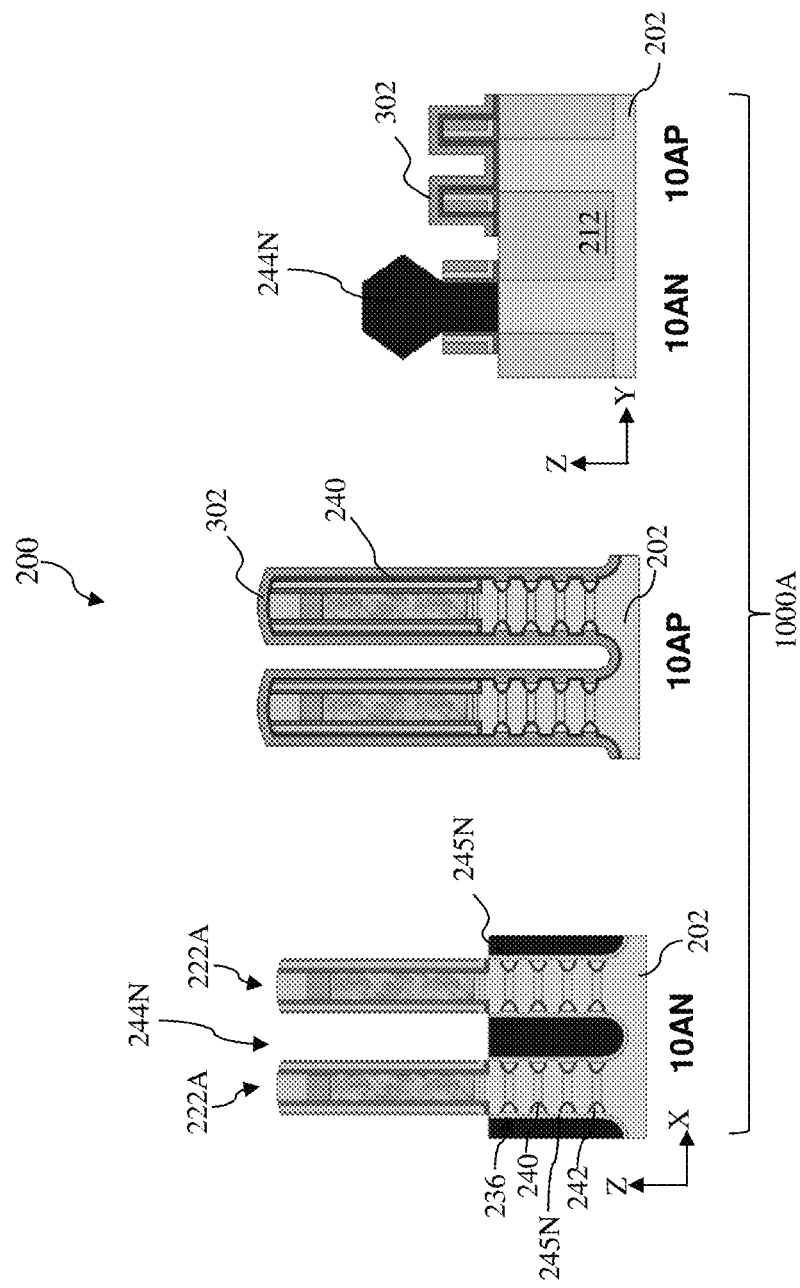
Figure 13B:
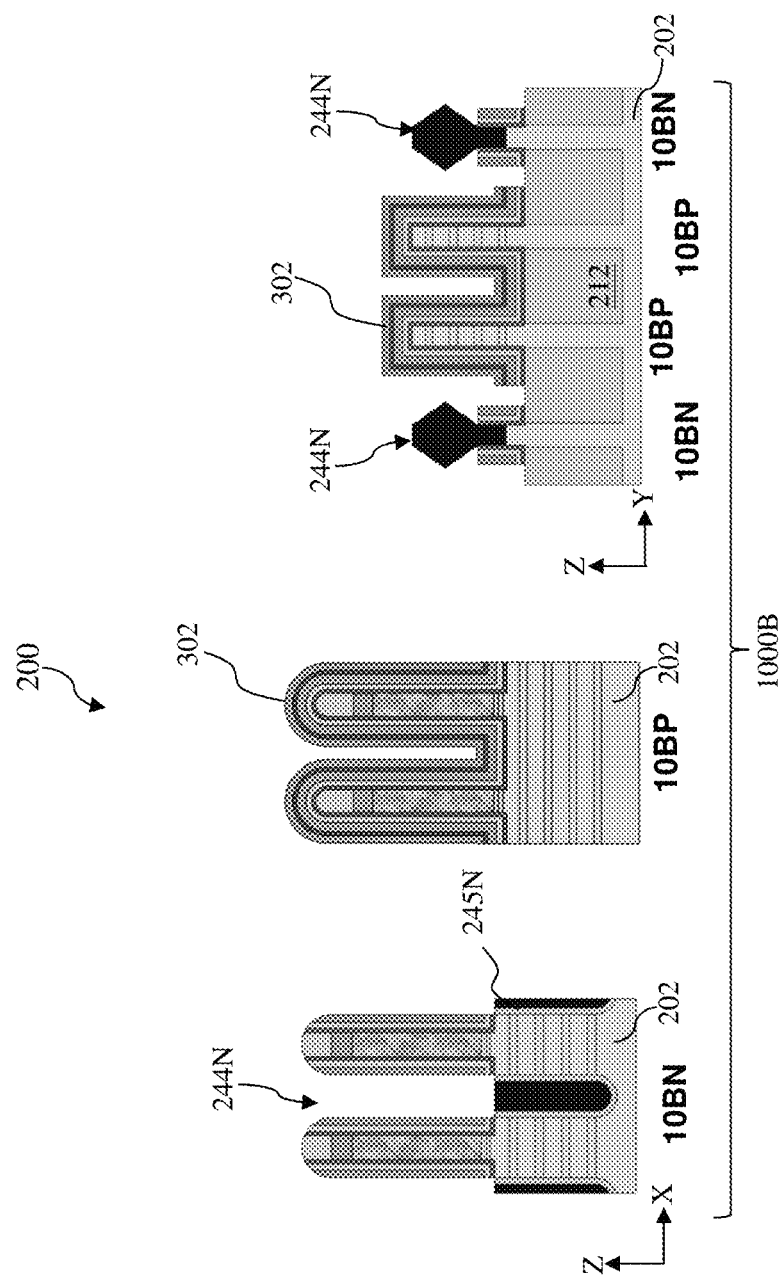

Referring to FIGS. 1B, 13A and 13B, the method 100 includes block 126 where n-type epitaxial source/drain features 244N are formed in the source/drain regions 500 of the n-type device region 10AN in the first device area 1000A and the n-type device region 10BN in the second device area 1000B. Suitable epitaxial processes for block 126 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process may use gaseous and/or liquid precursors, which interact with the composition of the substrate 202 as well as the channel layers 208. In the embodiments represented in FIGS. 14A and 14B, the n-type epitaxial source/drain features 244N are in direct contact with the channel layers 208 and the portions of the substrate 202 exposed in the first source/drain trench 218AN in the first device area 1000A and the second source/drain trench 218BN in the second device area 1000B. In those embodiments, the n-type epitaxial source/drain features 244N are not in direct contact with the sacrificial layers 206 in the first device area 1000A, due to the first inner spacer layer 240 and the second inner spacer layer 242 in the inner spacer recesses 236. The n-type epitaxial source/drain features 244N are in direct contact with the first inner spacer layer 240 and the second inner spacer layer 242 deposited in the inner spacer recesses 236. The configuration for the second device area 1000B is different. The n-type epitaxial source/drain feature 244N in the second device area 1000B may be in direct contact with the sacrificial layer 206 in the second device area 1000B because no inner spacer recesses are formed in the second device area 1000B and there are no first inner spacer layer 240 and the second inner spacer layer 242 to separate the n-type epitaxial source/drain feature 244N from the sacrificial layer. In the embodiments represented in FIG. 12A, there are two inner spacer layers and the first inner spacer layer 240 and the second inner spacer layer 242 disposed within each of the inner spacer recesses 236 may be collectively referred to as an inner spacer feature 241. In each of the inner spacer feature 241, the first inner spacer layer 240 wraps around the second inner spacer layer 242 and leaves only an exterior sidewall of the second inner spacer layer 242 exposed. In other embodiments where there is only a single inner spacer layer, each of the inner spacer feature 241 has a single-layer construction.

In various embodiments, the n-type epitaxial source/drain features 244N may include Si, GaAs, GaAsP, SiP, or other suitable material. The n-type epitaxial source/drain features 244N may be in-situ doped during the epitaxial process by introducing doping species including n-type dopants, such as phosphorus or arsenic; and/or other suitable dopants including combinations thereof. If the n-type epitaxial source/drain features 244N are not in-situ doped, an implantation process (i.e., a junction implant process) is performed to dope the n-type epitaxial source/drain features 244N. In an exemplary embodiment, the n-type epitaxial source/drain features 244N in an NMOS device include SiP.

In some embodiments, the n-type epitaxial source/drain features 244N may include multiple layers. In some embodiments illustrated in FIGS. 13A and 13B, the n-type epitaxial source/drain features 244N in the first device area 1000A and the n-type epitaxial source/drain feature 244N in the second device area 1000B each include a first initial layer 245N. In some embodiments, the first initial layer 245N may include silicon and carbon and may be formed using a separate epitaxy process. The first initial layer 245N may function as an etch stop layer for the channel member release process and may be referred to as a wire release stop layer (RSL). The first initial layer 245N may also function to prevent leakage. In some alternative implementations as described above in conjunction with FIG. 11B, the regrown epitaxial silicon layer may be formed and the first initial layer 245N may be omitted. It is noted that because the inner spacers in the first device area 1000A already serve similar functions of the first initial layer 245N, the first initial layer 245N may be omitted in the first device area 1000A without any negative consequences.

Figure 14A:
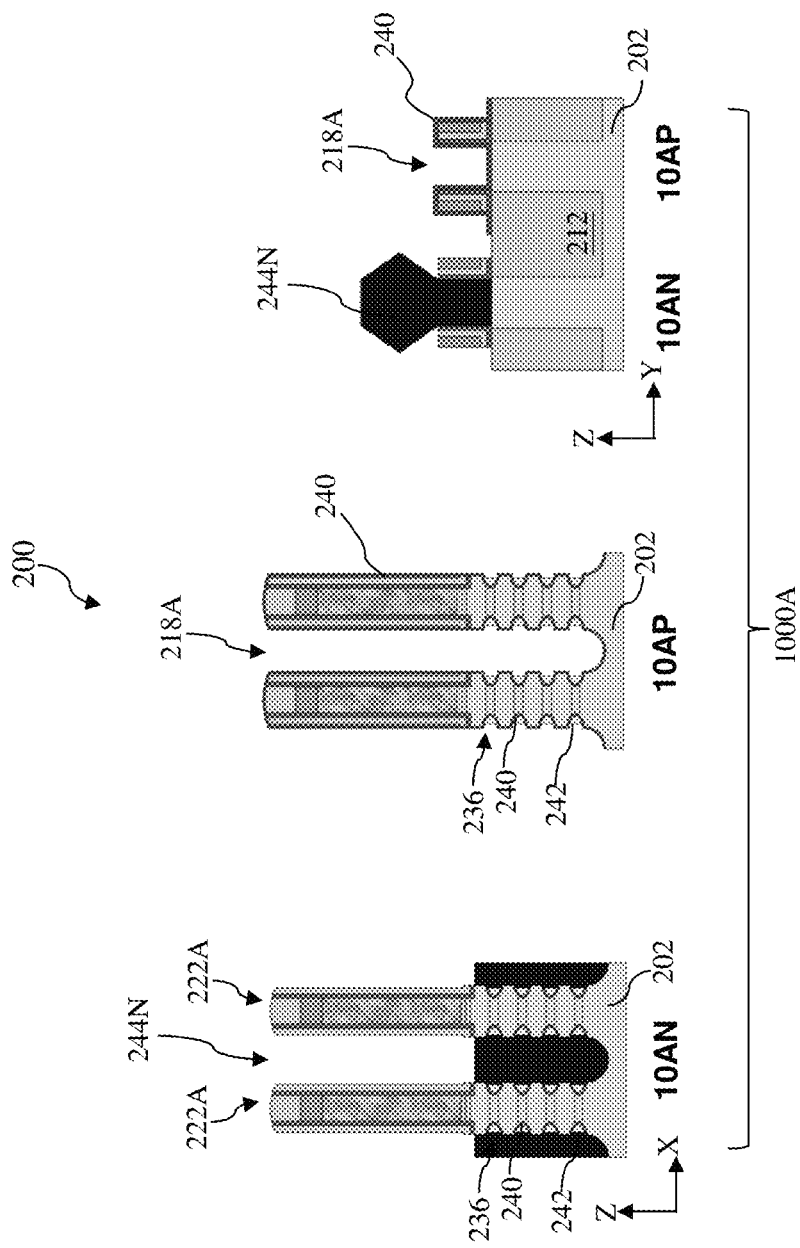
Figure 14B:
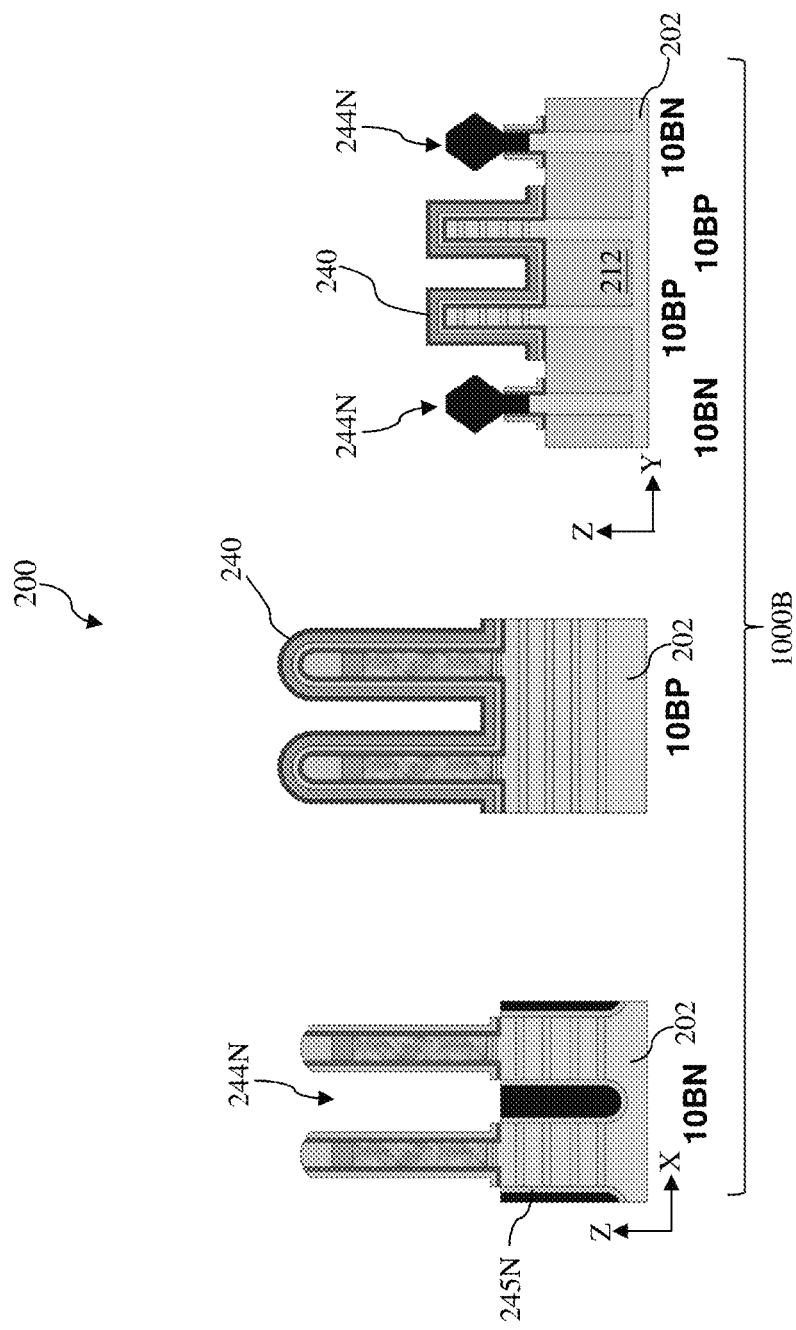

Referring to FIGS. 1C, 14A and 14B, the method 100 includes block 128 where the first pattern film 302 is removed. In some embodiments represented in FIGS. 14A and 14B, the remaining first pattern film 302 deposited over the p-type device region 10AP in the first device area 1000A and the p-type device region 10BP in the second device area 1000B is removed. In some embodiments, the first pattern film 302 may be selectively removed using a suitable dry etch process or wet etch process. In some instances, a suitable wet etch process may include use of a phosphoric acid solution.

Referring now to FIGS. 1C, 15A, 15B, 16A, and 16B, the method 100 includes block 130 where a second pattern film 306 is formed over the workpiece 200 to expose the p-type device region 10AP in the first device area 1000A is removed. An example process is described as follows.

Figure 15B:
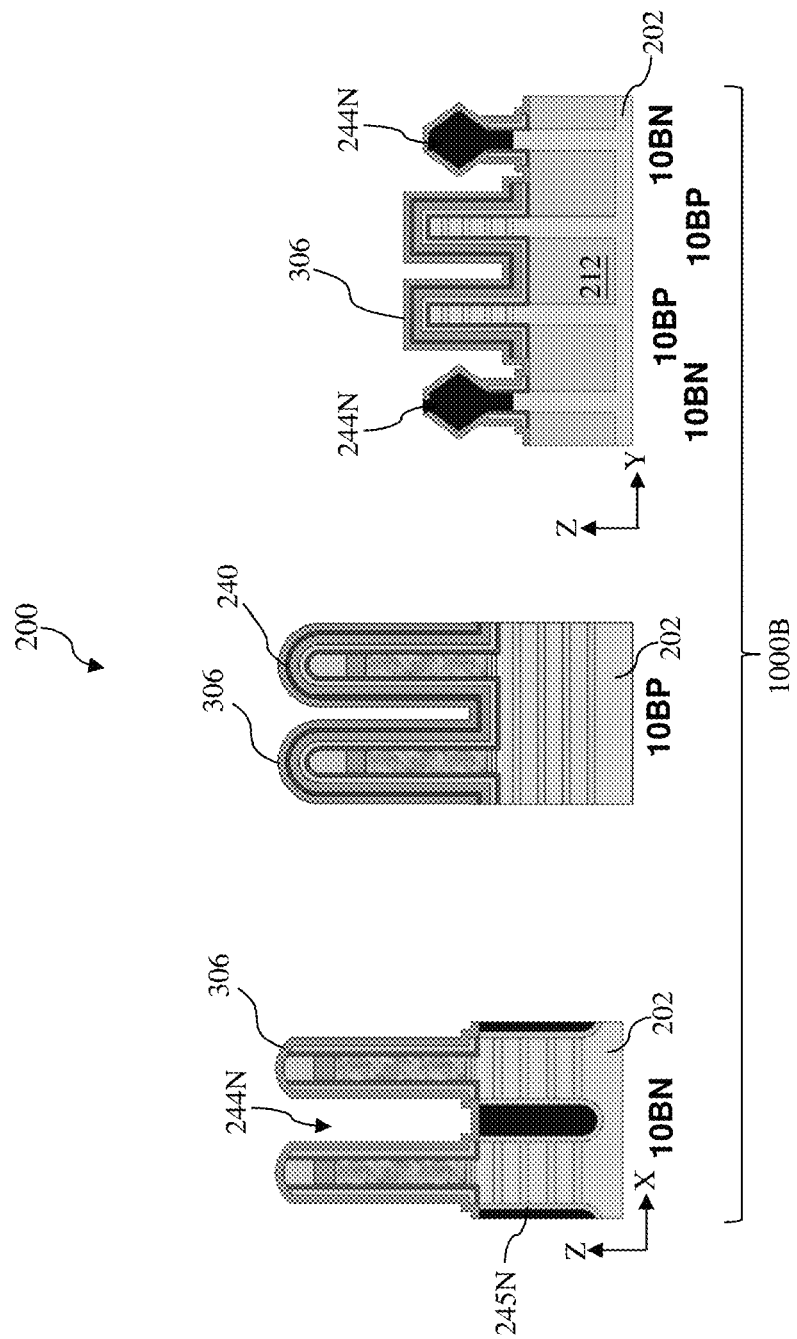
Figure 16A:
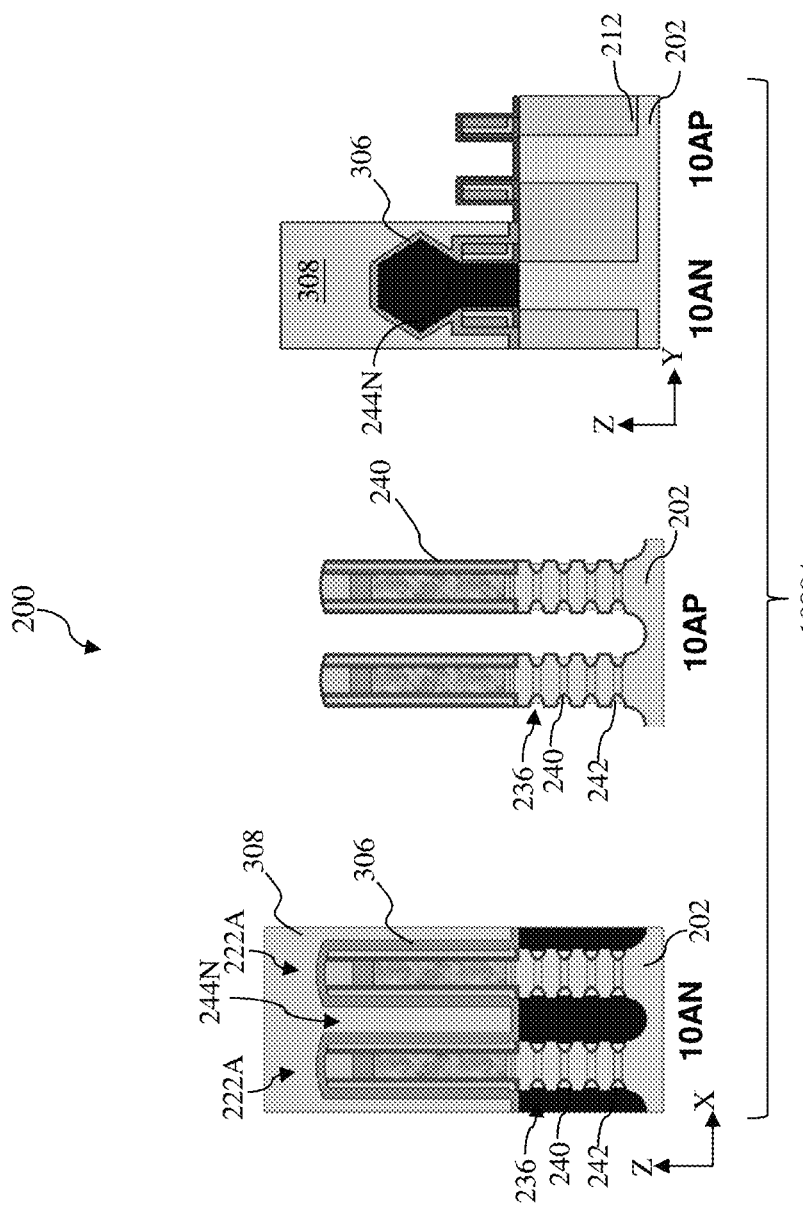
Figure 16B:
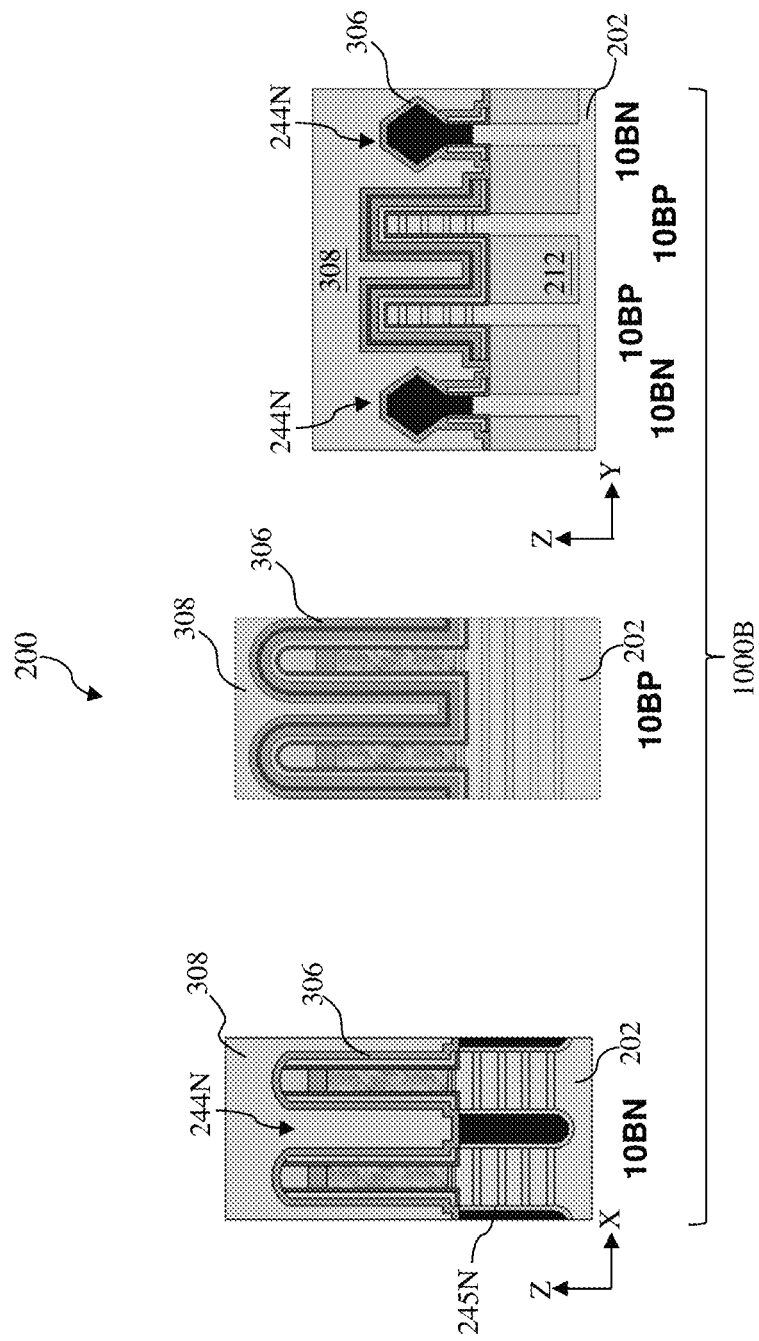

Reference is first made to FIGS. 15A and 15B, a second pattern film 306 is deposited over the first device area 1000A and the second device area 1000B of the workpiece 200. The composition and formation process for the second pattern film 306 may be similar to those of the first pattern film 302 and will be not repeated here. A second photoresist layer 308 is then deposited over the second pattern film 306 and patterned using photolithography techniques to expose the p-type device region 10AP in the first device area 1000A. The portion of the second pattern film 306 over the p-type device region 10AP in the first device area 1000A is then removed by a wet etch, a dry etch, or a suitable method.

Figure 17A:
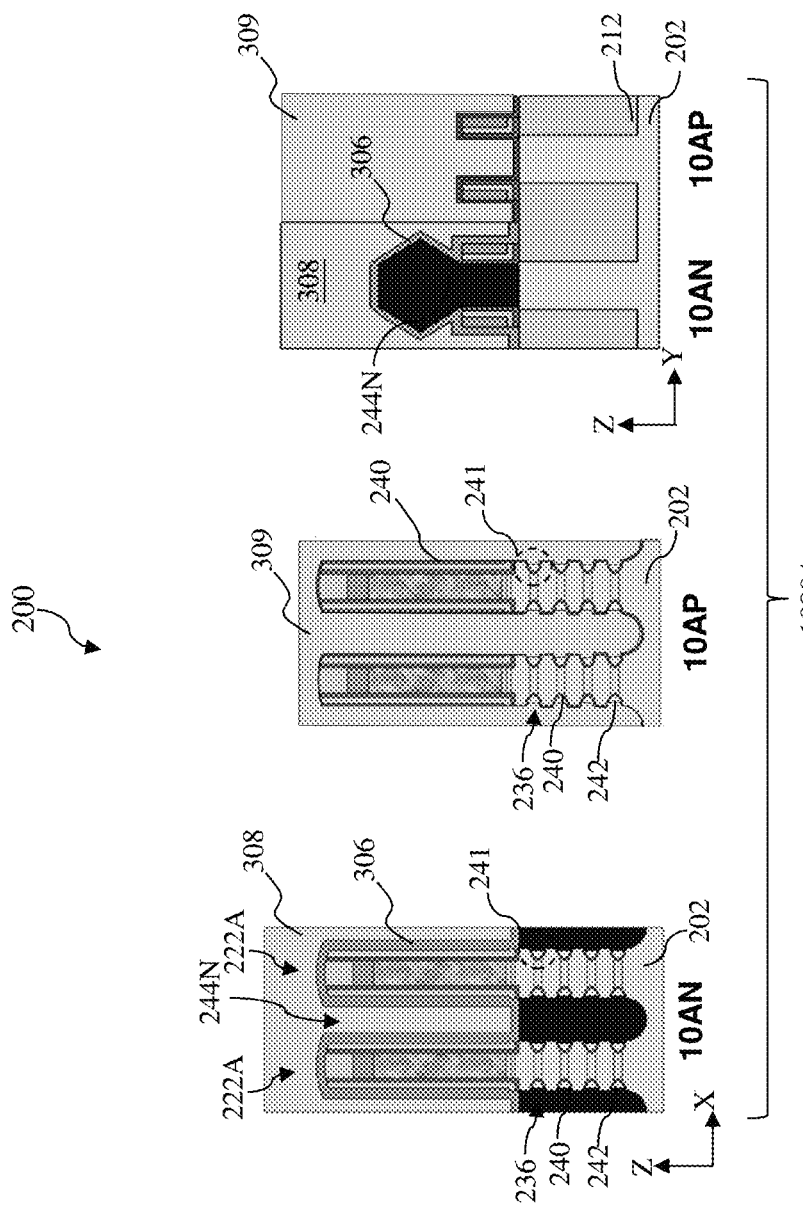
Figure 17B:
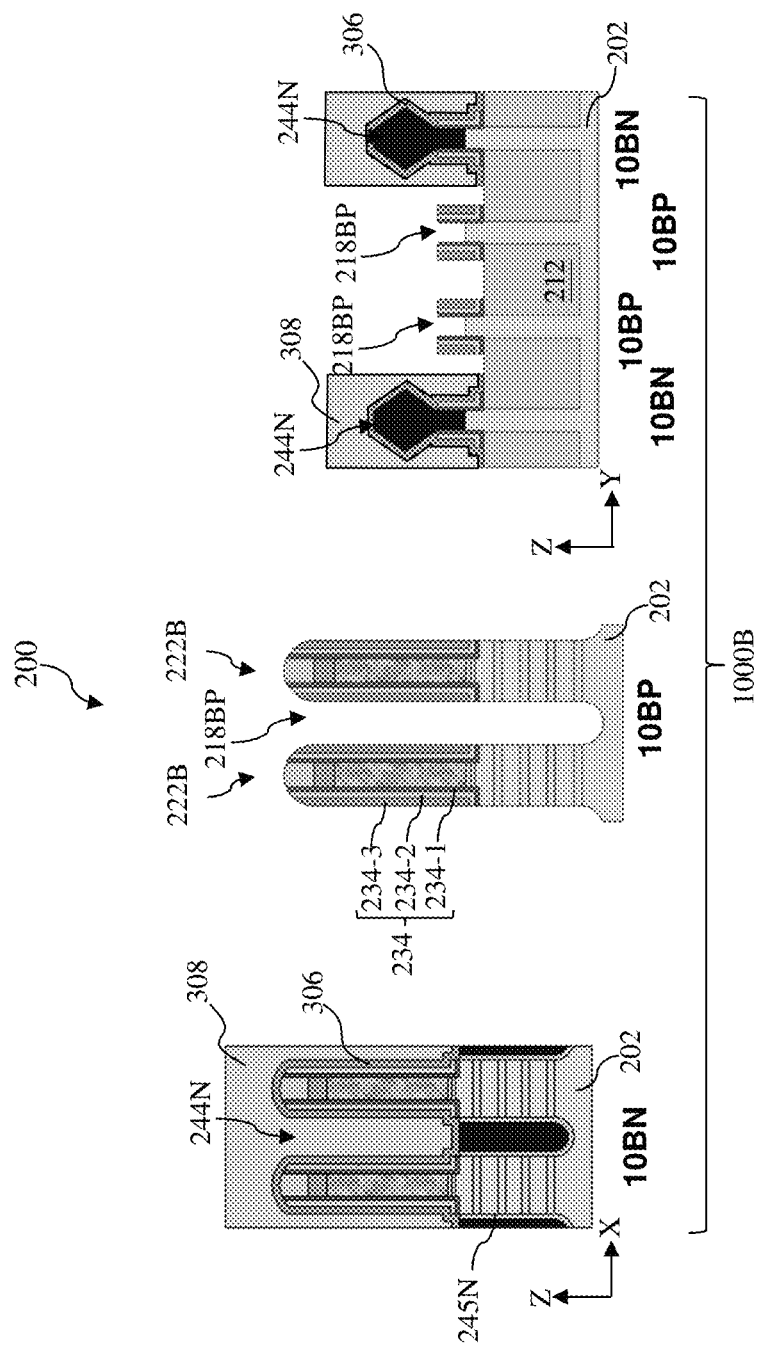
Figure 18A:
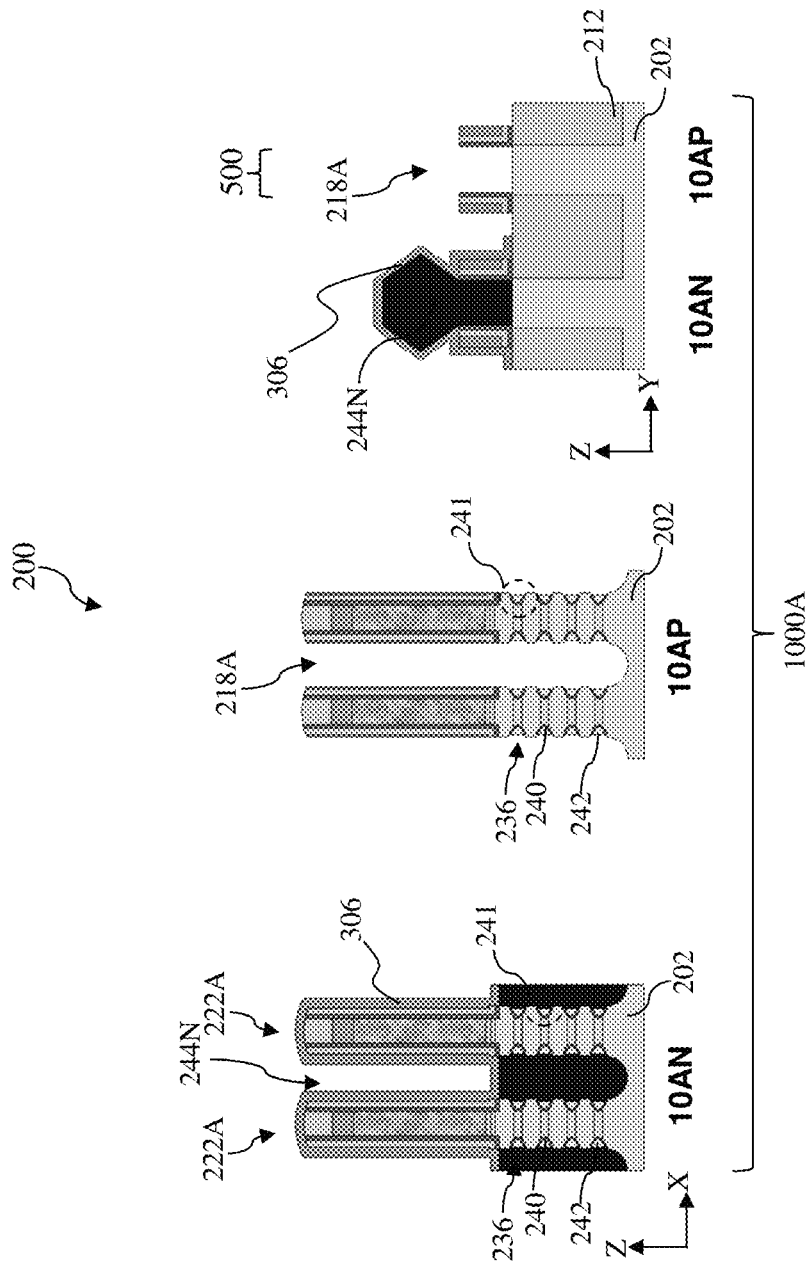
Figure 18B:
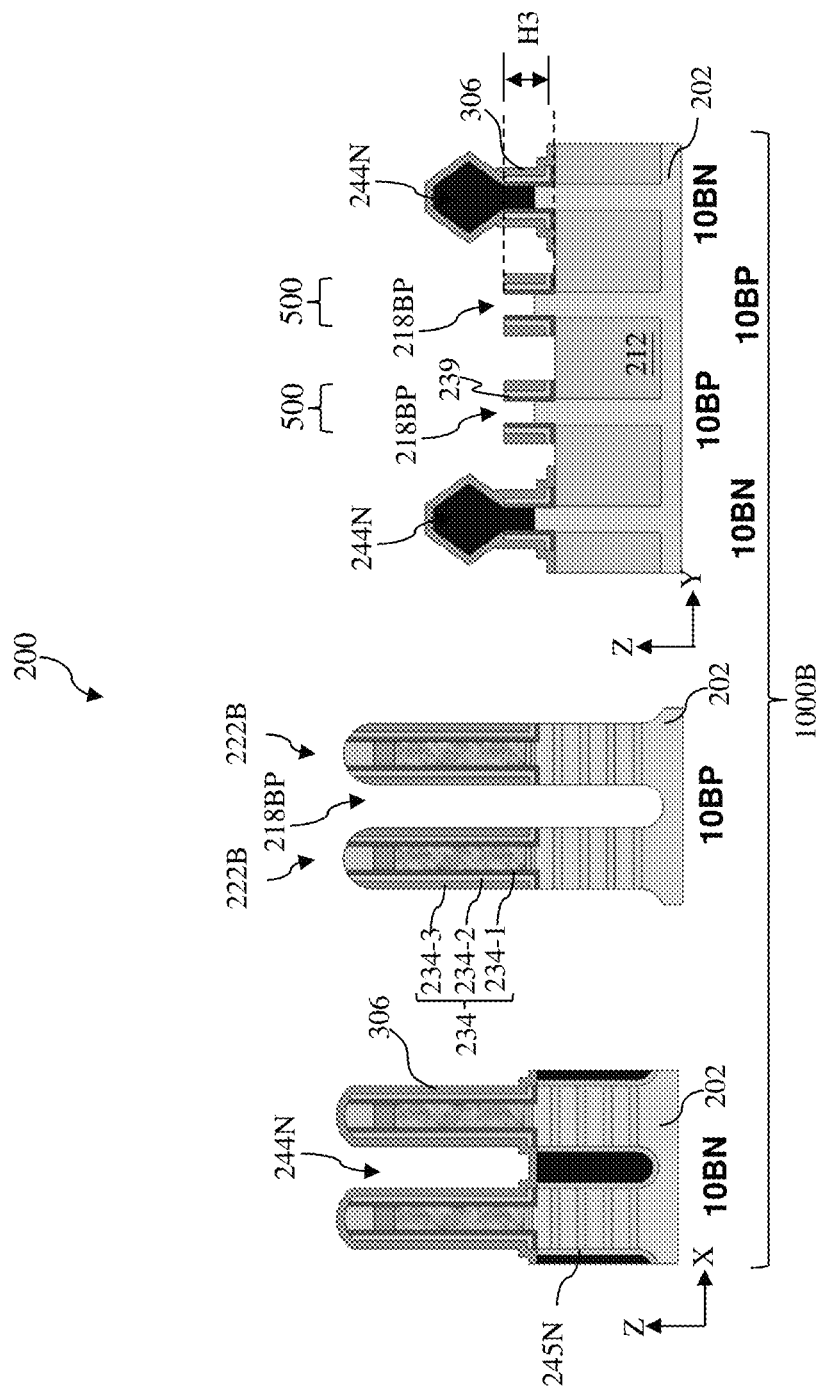

Referring now to FIGS. 1C, 17A, 17B, 18A, and 18B the method 100 includes block 132 where source/drain regions 500 of the second fin elements 210B in the p-type device region 10BP in the second device area 1000B are. In some embodiments shown in FIG. 17A, a second supplemental photoresist layer 309 is deposited to mask the exposed p-type device region 10AP in the first device area 1000A. A photolithography process is then performed to expose the p-type device region 10BP in the second device area 1000B, as shown in FIG. 17B. Thereafter, in some embodiments, the portions of the second fin elements 210B that are not covered by the second dummy gate stack 222B and the gate spacers 234 are etched by a dry etch or a suitable etching process to form a third source/drain trench 218BP. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments represented in FIGS. 18A and 18B, the upper portion of the second fin element 210B is recessed to expose the sacrificial layers 206 and the channel layers 208. In some implementations, at least a portion of the lower portion of the second fin elements 210B are recessed as well. That is, the third source/drain trench 218BP may extend below the bottom-most sacrificial layer 206. Upon conclusion of operations in block 132, the source/drain regions 500 of the second fin elements 210B may become level with to or lower than the top surface of the STI features 212. The remaining gate spacer 234 that defines the third source/drain trench 218BP may be referred to as a third fin sidewall 239 in FIG. 18B. In some instances, the third fin sidewall 239 has a third height H3 and the third height H3 may be similar to the second height H2, which is between about 15 nm and about 40 nm.

In the embodiments represented in FIG. 17A, there are two inner spacer layers and the first inner spacer layer 240 and the second inner spacer layer 242 disposed within each of the inner spacer recesses 236 may be collectively referred to as an inner spacer feature 241. In each of the inner spacer feature 241 in the p-type device region 10AP, the first inner spacer layer 240 wraps around the second inner spacer layer 242 and leaves only an exterior sidewall of the second inner spacer layer 242 exposed. In other embodiments where there is only a single inner spacer layer, each of the inner spacer feature 241 has a single-layer construction. As shown in FIG. 17A, after the n-type epitaxial source/drain feature 244N is formed, the sidewall of the second inner spacer layer 242 (that is not covered by the first inner spacer layer 240) in the n-type device region 10AN is in contact with the n-type epitaxial source/drain feature 244N, or the first initial layer 245N.

In some embodiments not separately illustrated in the present disclosure, the exposed sacrificial layers 206 and the channel layers 208 in the p-type device region 10BP in the second device area 1000B shown in FIG. 17B may be isotropically and selectively trimmed until sidewalls of the exposed sacrificial layers 206 and the channel layers 208 are recessed and no longer flush with sidewalls of the gate spacer 234. A silicon layer may then be epitaxially grown over the recessed sidewalls of the exposed sacrificial layers 206 and the channel layers 208 to form a regrown epitaxial silicon layer that is substantially flush with the sidewalls of the gate spacer 234. In some implementations, the regrown epitaxial silicon layer formed in the p-type device region 10BP may be doped with boron. In these embodiments, the trimming helps increase volume of p-type epitaxial source/drain features to ensure sufficient stress is exerted on the channel members and the regrown epitaxial silicon layer reduces leakage and increases reliability of the channel members.

Figure 19A:
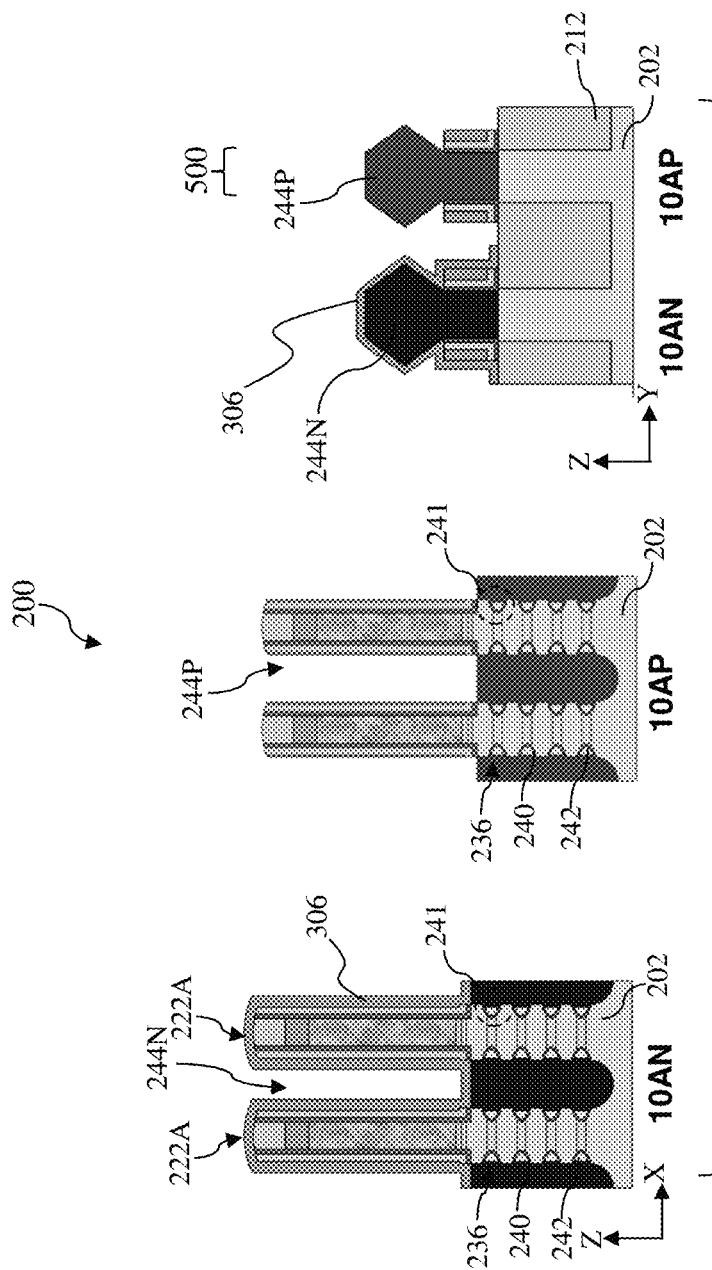
Figure 19B:
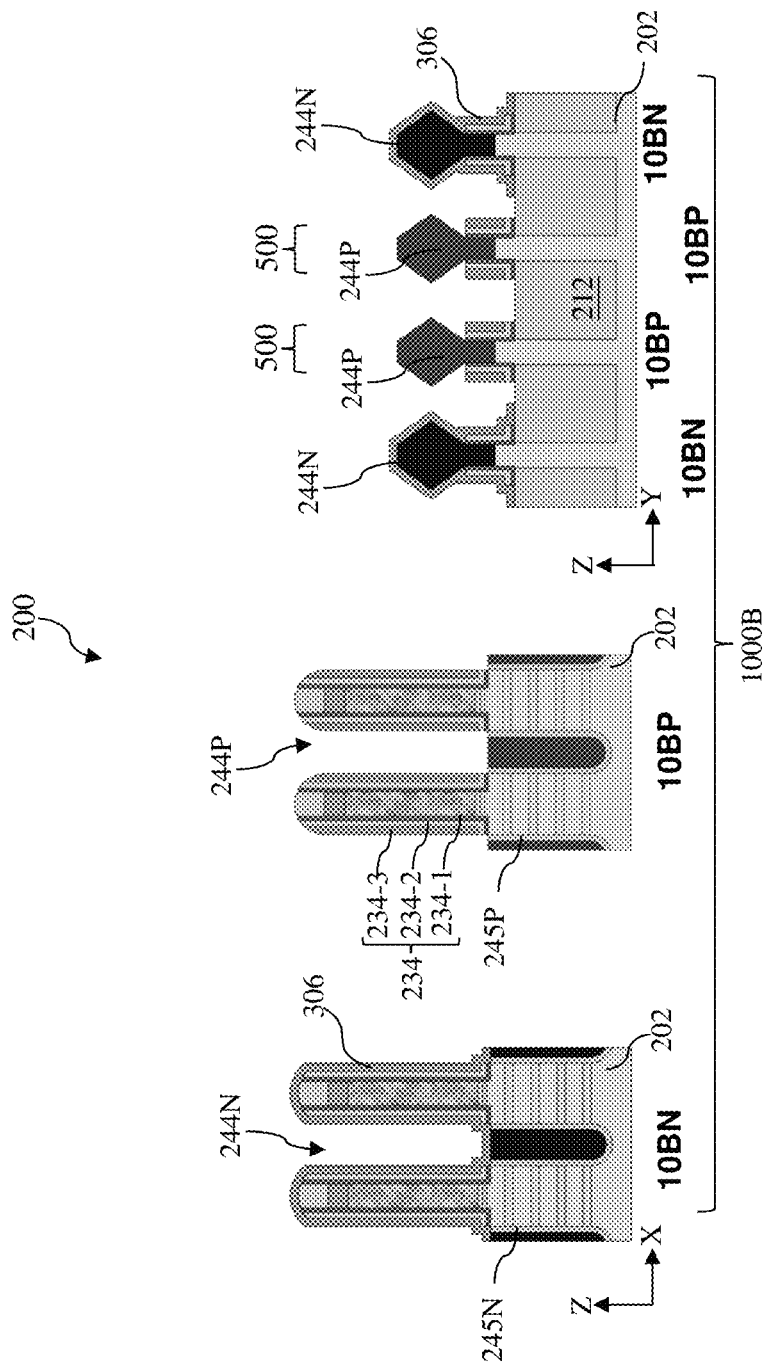

Referring now to FIGS. 1C, 19A and 19B, the method 100 includes block 134 where a p-type epitaxial source/drain feature 244P is formed over source/drain regions 500 in the p-type device region 10AP in the first device area 1000A as well as the p-type device region 10BP in the second device area 1000B. Suitable epitaxial processes for block 134 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process may use gaseous and/or liquid precursors, which interact with the composition of the substrate 202, the channel layers 208 or an initial layer (if present, such as a second initial layer 245P described below). The p-type epitaxial source/drain features 244P may be in direct contact with the substrate 202, the channel layers 208, the sacrificial layers 206, or the initial layer ((if present, such as a second initial layer 245P described below). As inner spacers are not implemented in the second device area 1000B, the channel layers 208 and the sacrificial layers 206 in the second device area 1000B are not separated by any inner spacers.

In various embodiments, the p-type epitaxial source/drain features 244P may include Si, Ge, AlGaAs, SiGe, boron-doped SiGe, or other suitable material. The p-type epitaxial source/drain features 244P may be in-situ doped during the epitaxial process by introducing doping species including p-type dopants, such as boron or $BF_2$, and/or other suitable dopants including combinations thereof. If the p-type epitaxial source/drain features 244P are not in-situ doped, an implantation process (i.e., a junction implant process) is performed to dope the p-type epitaxial source/drain features 244P. In an exemplary embodiment, the p-type epitaxial source/drain features 244P in a PMOS device include SiGeB.

In some embodiments, the p-type epitaxial source/drain features 244P may include multiple layers. In some embodiments illustrated in FIGS. 19A and 19B, the p-type epitaxial source/drain features 244P in the first device area 1000A and the p-type epitaxial source/drain feature 244P in the second device area 1000B each include a second initial layer 245P. In some embodiments, the second initial layer 245P may include silicon and boron and may be formed using a separate epitaxy process. In some implementations, the sacrificial layers 206 and the channel layers 208 exposed in the first source/drain trench 218A and the third source/drain trench 218BP may be trimmed and a silicon regrowth process may be performed to form the second initial layer 245P. The second initial layer 245P may function as an etch stop layer for the channel member release process and may be referred to as a wire release stop layer (RSL). The second initial layer 245P may also function to prevent leakage. In some alternative implementations as described above in conjunction with FIG. 17B, the regrown epitaxial silicon layer may be formed and the second initial layer 245P may be omitted. It is noted that because the inner spacers in the first device area 1000A already serve similar functions of the second initial layer 245P, the second initial layer 245P may be omitted in the first device area 1000A without any negative consequences.

As shown in FIG. 19A, after the p-type epitaxial source/drain feature 244P is formed, the sidewall of the second inner spacer layer 242 (that is not covered by the first inner spacer layer 240) in the p-type device region 10AP is in contact with the p-type epitaxial source/drain feature 244P, or the second initial layer 245P.

Figure 20A:
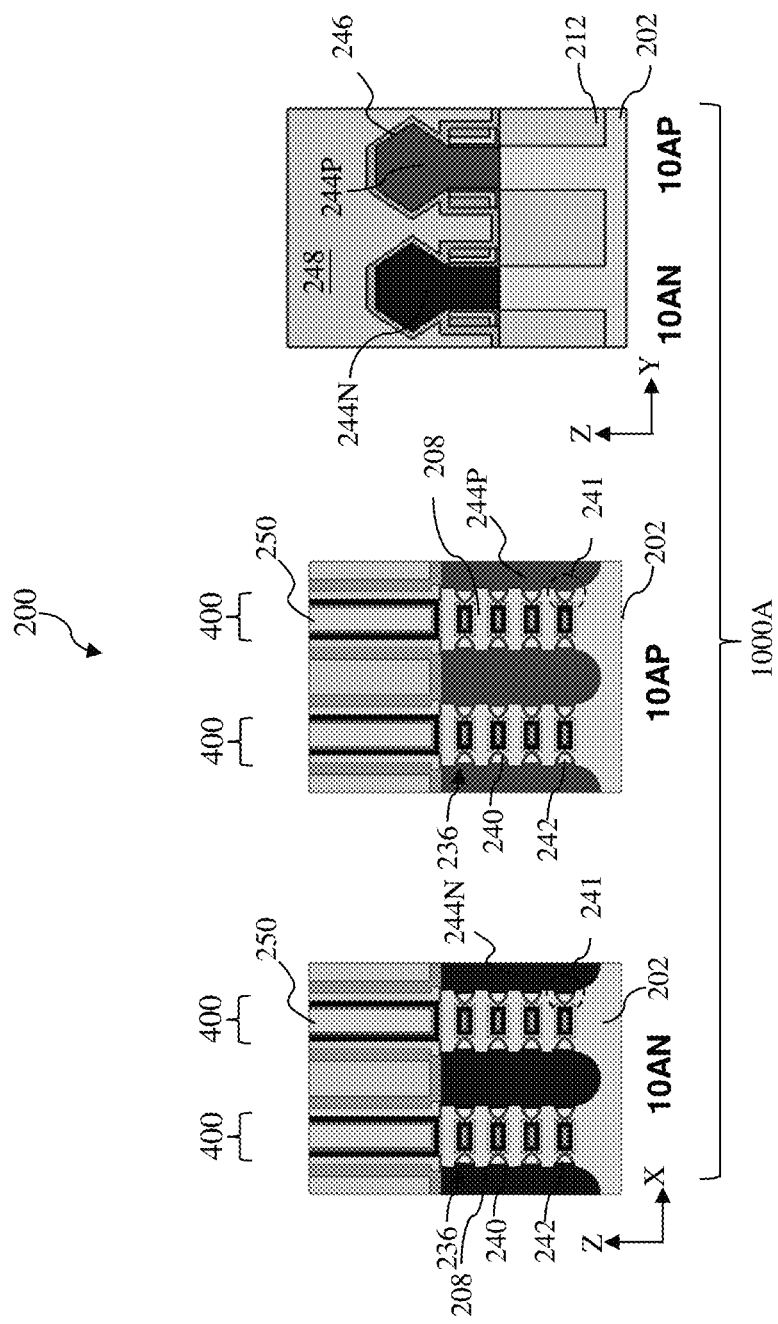
Figure 20B:
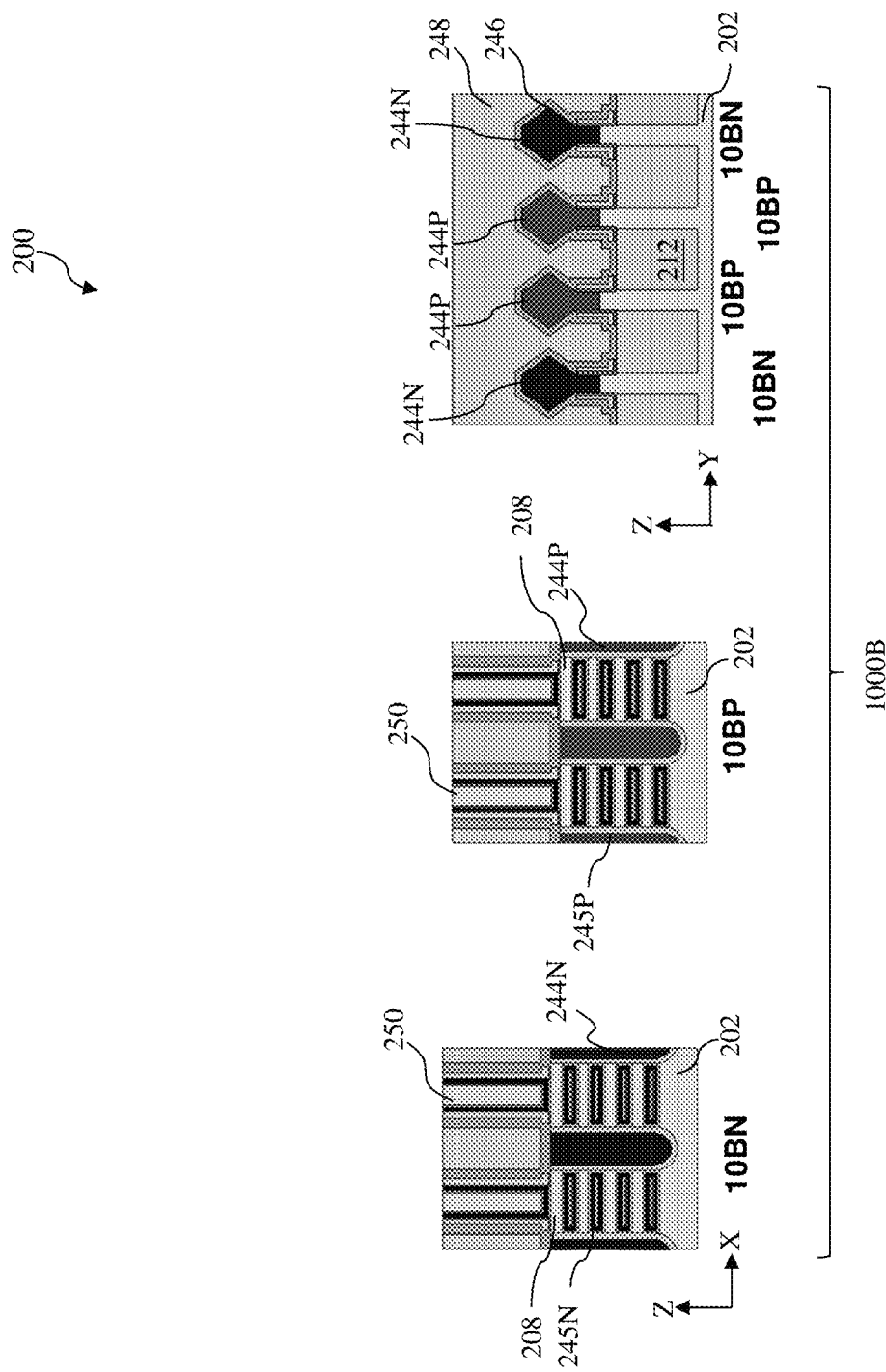

Referring now to FIGS. 1C, 20A and 20B, the method 100 includes block 136 where further processes are performed. As illustrated in FIGS. 20A and 20B, such further processes may include deposition of a contact etch stop layer (CESL) 246, deposition of an interlayer dielectric (ILD) layer 248, removal of the first dummy gate stacks 222A and the second dummy gate stacks 222B, release of the channel layers 208 as the channel members 208, formation of a metal gate stack 250, and planarization of the workpiece 200. In some embodiments, the CESL 246 is formed prior to forming the ILD layer 248 but after the second pattern film 306 is removed. In some examples, the CESL 246 includes a silicon nitride layer, a silicon oxide layer, a silicon oxynitride layer, and/or other materials known in the art. The CESL 246 may be formed by ALD, plasma-enhanced chemical vapor deposition (PECVD) process and/or other suitable deposition or oxidation processes. The ILD layer 248 is then deposited over the CESL 246. In some embodiments, the ILD layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 248 may be deposited by a PECVD process or other suitable deposition technique. In some embodiments, after formation of the ILD layer 248, the workpiece 200 may be annealed to improve integrity of the ILD layer 248.

In some examples, after depositing the ILD layer 248, a planarization process may be performed to remove excessive dielectric materials. For example, a planarization process includes a chemical mechanical planarization (CMP) process which removes portions of the ILD layer 248 (and CESL 246, if present) overlying the dummy gate stack 222 (including the first dummy gate stack 222A and the second dummy gate stack 222B) and planarizes a top surface of the workpiece 200. In some embodiments, the CMP process also removes hard mask 228 and exposes the dummy electrode layer 226. Exposure of the dummy electrode layer 226 allows the removal of the dummy electrode layer 226 and release of the channel layers 208.

In some embodiments, the removal of the dummy gate stacks 222 (including the first dummy gate stack 222A and the second dummy gate stack 222B) results in gate trenches over the channel regions 400. A metal gate stack 250 may be subsequently formed in the gate trenches, as will be described below. The removal of the dummy gate stacks 222 may include one or more etching processes that are selective to the material in the dummy gate stack 222. For example, the removal of the dummy gate stack 222 may be performed using as a selective wet etch, a selective dry etch, or a combination thereof that is selective to the dummy electrode layer 226. The epitaxial layers 206 and 208 of the fin element 210 (i.e. first fin element 210A or second fin element 210B) are exposed in the gate trench.

After the removal of the dummy gate stacks 222, the method 100 may include operations to selectively remove the sacrificial layers 206 between the channel layers 208 in the channel regions 400. The selective removal of the sacrificial layers 206 releases the channel layers 208 to form channel members 208. It is noted that the same reference numeral 208 is used to denote channel members 208 for simplicity. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by ozone clean and then SiGeOx removed by an etchant such as $NH_4OH$.

The method 100 may include further operations to form the metal gate stack 250. The metal gate stack 250 may be a high-K metal gate stack. In some embodiments, the metal gate stack 250 is formed within the gate trenches over the workpiece 200 and is deposited in the space left behind by the removal of the sacrificial layers 206. In this regard, the metal gate stack 250 wraps around each of the channel members 208 in each of the first fin elements 210A and the second fin elements 210B. In various embodiments, the metal gate stack 250 (or high-K metal gate stack 250) includes an interfacial layer, a high-K gate dielectric layer formed over the interfacial layer, and/or a gate electrode layer formed over the high-K gate dielectric layer. High-K gate dielectrics, as used and described herein, include dielectric materials having a high dielectric constant, for example, greater than that of thermal silicon oxide (~3.9). The gate electrode layer used within the metal gate stack 250 may include a metal, metal alloy, or metal silicide. Additionally, the formation of the metal gate stack 250 may include depositions to form various gate materials, one or more liner layers, and one or more CMP processes to remove excessive gate materials and thereby planarize a top surface of the workpiece 200.

In some embodiments, the interfacial layer of the metal gate stack 250 may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer of the metal gate stack 250 may include a high-K dielectric layer such as hafnium oxide. Alternatively, the high-K gate dielectric layer of the metal gate stack 250 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

The gate electrode layer of the metal gate stack 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer of metal gate stack 250 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer of the metal gate stack 250 may be formed by ALD, PVD, CVD, e-beam evaporation, or other suitable process. Further, the gate electrode layer may be formed separately for N-FET and P-FET transistors which may use different metal layers (e.g., for providing different n-type and p-type work function metal layers). In various embodiments, a CMP process may be performed to remove excessive metal from the gate electrode layer of the metal gate stack 250, and thereby provide a substantially planar top surface of the metal gate stack 250. The metal gate stack 250 includes portions that interpose between channel members 208 in the channel regions 400.

Although not intended to be limiting, one or more embodiments of the present disclosure provide many benefits to a semiconductor device and the formation thereof. For example, embodiments of the present disclosure provide selective inner spacer implementation where inner spacers are implemented in a first device area that includes devices having a first fin width but are not implemented in a second device area that includes devices having a second fin width smaller than the first width. In some applications, the first device area may be appropriate for logic devices and the second device area may be appropriate for static random access memory (SRAM) devices.

In one exemplary aspect, the present disclosure is directed to a semiconductor device. The semiconductor device includes a first plurality of gate-all-around (GAA) devices in a first device area and a second plurality of GAA devices in a second device area. Each of the first plurality of GAA devices includes a first vertical stack of channel members, a first gate structure over and around the first vertical stack of channel members, a plurality of inner spacer features, and a second plurality of GAA devices in a second device area. Each of the second plurality of GAA devices includes a second vertical stack of channel members, and a second gate structure over and around the second vertical stack of channel members. Two adjacent channel members of the first vertical stack of channel members are separated by a portion of the first gate structure and at least one of the plurality of inner spacer features and two adjacent channel members of the second vertical stack of channel members are separated only by a portion of the second gate structure.

In some embodiments, the first device area is a logic device area and the second device area is a memory device area. In some implementations, each of the first vertical stack of channel members has a first width along a direction of the first gate structure, each of the second vertical stack of channel members has a second width along the direction, and the first width is greater than the second width. In some implementations, the first width is between about 16 nm and about 30 nm. In some instances, the second width is between about 6 nm and about 15 nm. In some embodiments, each of the plurality of inner spacer features includes metal oxide, silicon carbonitride, silicon oxycarbonitride, or silicon oxycarbide. In some embodiments, each of the first plurality of GAA devices further includes a first source/drain feature adjacent the first vertical stack of channel members, each of the second plurality of GAA devices further includes a second source/drain feature adjacent the second vertical stack of channel members. The first source/drain feature is in contact with at least one of the plurality of inner spacer features and the second source/drain feature is in contact with the portion of the second gate structure between two adjacent channel members of the second vertical stack of channel members.

In another exemplary aspect, the present disclosure is directed to a semiconductor device. The semiconductor device includes a first gate-all-around (GAA) device and a second GAA device. The first GAA device includes first channel members in a channel region of the first GAA device, a first gate structure over and around the first channel members, and inner spacer features. The second GAA device includes second channel members in a channel region of the second GAA device, and a second gate structure over and around the second channel members. Two adjacent first channel members are separated by a portion of the first gate structure and at least one of the inner spacer features and two adjacent second channel members are separated only by a portion of the second gate structure.

In some embodiments, the inner spacer features each have a single-layer construction. In some implementations, the inner spacer features each include a first layer and a second layer, the first layer includes a metal oxide or silicon carbonitride, and the second layer includes silicon oxycarbonitride or silicon oxycarbide. In some embodiments, a dielectric constant of the first layer is greater than a dielectric constant of the second layer. In some embodiments, the first GAA device is disposed in a logic device area and the second GAA device is disposed into a static random access memory (SRAM) device area. In some implementations, each of the first channel members has a first width, each of the second channel members has a second width, and the first width is greater than the second width. In some embodiments, the first width is between about 16 nm and about 30 nm and the second width is between about 6 nm and about 15 nm. In some instances, the first GAA device further includes a first source/drain feature and a second source/drain feature on either side of the channel region of the first GAA device and a portion of the first gate structure between two of the first channel members extends between two of the inner spacer features. The second GAA device further includes a third source/drain feature and a fourth source/drain feature on either side of the channel region of the second GAA device and a portion of the second gate structure between two of the second channel members are in contact with and extend between the third source/drain feature and the fourth source/drain feature.

In yet another exemplary aspect, the present disclosure is directed to a method of fabricating a semiconductor device. The method of fabricating a semiconductor device includes forming on a substrate a layer stack including a plurality of first semiconductor layers interleaved by a plurality of second semiconductor layers, forming a first fin element from the layer stack in a first area of the substrate, forming a second fin element from the layer stack in a second area of the substrate, etching a first source/drain trench exposing sidewalls of the plurality of first semiconductor layers and the plurality of second semiconductor layers in the first fin element while masking the second fin element with a pattern film, selectively recessing the plurality of second semiconductor layers in the first fin element to form inner spacer recesses while masking the second fin element with the pattern film, depositing an inner spacer layer within the inner spacer recesses and over the pattern film over the second fin element, etching a second source/drain trench exposing sidewalls of the plurality of first semiconductor layers and the plurality of second semiconductor layers in the second fin element, and simultaneously forming a first epitaxial source/drain feature in the first source/drain trench and a second epitaxial source/drain feature in the second source/drain trench.

In some implementations, the first fin element has a first width and the second fin element has a second width smaller than the second width. In some implementations, the first area is a logic device area and the second area is a memory device area. In some embodiments, the memory device area consists essentially of static random access memory (SRAM) devices. In some instances, the depositing of the inner spacer layer includes depositing a first inner spacer layer within the inner spacer recesses and over the pattern film over the second fin element, depositing a second inner spacer layer over the first inner spacer layer, and recessing the second inner spacer layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first plurality of gate-all-around (GAA) devices in a first device area, wherein each of the first plurality of GAA devices comprises:
a first vertical stack of channel members,
a first gate structure over and around the first vertical stack of channel members,
a plurality of inner spacer features; and
a second plurality of GAA devices in a second device area, wherein each of the second plurality of GAA devices comprises:
a second vertical stack of channel members, and
a second gate structure over and around the second vertical stack of channel members,
wherein two adjacent channel members of the first vertical stack of channel members are separated by a portion of the first gate structure and at least one of the plurality of inner spacer features,
wherein two adjacent channel members of the second vertical stack of channel members are separated only by a portion of the second gate structure.

2. The semiconductor device of claim 1, wherein the first device area is a logic device area and the second device area is a memory device area.

3. The semiconductor device of claim 1,
wherein each of the first vertical stack of channel members has a first width along a direction of the first gate structure,
wherein each of the second vertical stack of channel members has a second width along the direction,
wherein the first width is greater than the second width.

4. The semiconductor device of claim 3, wherein the first width is between about 16 nm and about 30 nm.

5. The semiconductor device of claim 3, wherein the second width is between about 6 nm and about 15 nm.

6. The semiconductor device of claim 1, wherein each of the plurality of inner spacer features comprises metal oxide, silicon carbonitride, silicon oxycarbonitride, or silicon oxycarbide.

7. The semiconductor device of claim 1,
wherein each of the first plurality of GAA devices further comprises a first source/drain feature adjacent the first vertical stack of channel members,
wherein each of the second plurality of GAA devices further comprises a second source/drain feature adjacent the second vertical stack of channel members,
wherein the first source/drain feature is in contact with at least one of the plurality of inner spacer features,
wherein the second source/drain feature is in contact with the portion of the second gate structure between two adjacent channel members of the second vertical stack of channel members.

8. A semiconductor device, comprising:
a first gate-all-around (GAA) device comprising:
first channel members in a channel region of the first GAA device,
a first gate structure over and around the first channel members, and inner spacer features; and
a second GAA device comprising:
second channel members in a channel region of the second GAA device, and
a second gate structure over and around the second channel members,
wherein two adjacent first channel members are separated by a portion of the first gate structure and at least one of the inner spacer features,
wherein two adjacent second channel members are separated only by a portion of the second gate structure.

9. The semiconductor device of claim 8, wherein the inner spacer features each have a single-layer construction.

10. The semiconductor device of claim 8,
wherein the inner spacer features each comprise a first layer and a second layer,
wherein the first layer comprises a metal oxide or silicon carbonitride,
wherein the second layer comprises silicon oxycarbonitride or silicon oxycarbide.

11. The semiconductor device of claim 10, wherein a dielectric constant of the first layer is greater than a dielectric constant of the second layer.

12. The semiconductor device of claim 8, wherein the first GAA device is disposed in a logic device area and the second GAA device is disposed into a static random access memory (SRAM) device area.

13. The semiconductor device of claim 8,
wherein each of the first channel members has a first width,
wherein each of the second channel members has a second width,
wherein the first width is greater than the second width.

14. The semiconductor device of claim 13, wherein the first width is between about 16 nm and about 30 nm and the second width is between about 6 nm and about 15 nm.

15. The semiconductor device of claim 8,
wherein the first GAA device further comprises a first source/drain feature and a second source/drain feature on either side of the channel region of the first GAA device,
wherein a portion of the first gate structure between two of the first channel members extends between two of the inner spacer features, wherein the second GAA device further comprises a third source/drain feature and a fourth source/drain feature on either side of the channel region of the second GAA device, wherein a portion of the second gate structure between two of the second channel members are in contact with and extend between the third source/drain feature and the fourth source/drain feature.

16. A semiconductor device, comprising:

a first multi-gate transistor comprising:
  first channel members extending between a first source/drain feature and a second source/drain feature,
  a first gate structure wrapping around each of the first channel members, and
  inner spacer features disposed between the first gate structure and the first source/drain feature as well as between the first gate structure and the second source/drain feature; and a second multi-gate transistor comprising:
  second channel members extending between a third source/drain feature and a fourth source/drain feature, and
  a second gate structure wrapping around each of the second channel members, wherein the third source/drain feature is spaced apart from the second gate structure and the second channel member by a release stop layer, and the second gate structure is in direct contact with the release stop layer.

17. The semiconductor device of claim 16,
wherein each of the first channel members has a first width,
wherein each of the second channel members has a second width smaller than the first width.

18. The semiconductor device of claim 16, wherein the release stop layer comprises silicon and carbon.

19. The semiconductor device of claim 16, wherein the inner spacer features each have a single-layer construction.

20. The semiconductor device of claim 16,
wherein the inner spacer features each comprise a first layer and a second layer,
wherein the first layer comprises a metal oxide or silicon carbonitride,
wherein the second layer comprises silicon oxycarbonitride or silicon oxycarbide.

* * * * *